(12) United States Patent
Morito et al.

(10) Patent No.: US 9,255,010 B2
(45) Date of Patent: Feb. 9, 2016

(54) BORIDE HAVING CHEMICAL COMPOSITION NA—SI—B, AND POLYCRYSTALLINE REACTION SINTERED PRODUCT OF BORIDE AND PROCESS FOR PRODUCTION THEREOF

(75) Inventors: Haruhiko Morito, Miyagi (JP); Hisanori Yamane, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 323 days.

(21) Appl. No.: 13/817,646

(22) PCT Filed: Aug. 17, 2011

(86) PCT No.: PCT/JP2011/068619
§ 371 (c)(1),
(2), (4) Date: Jun. 26, 2013

(87) PCT Pub. No.: WO2012/023568
PCT Pub. Date: Feb. 23, 2012

(65) Prior Publication Data
US 2013/0266499 A1    Oct. 10, 2013

(30) Foreign Application Priority Data

Aug. 19, 2010  (JP) ................................ 2010-183889
Aug. 19, 2010  (JP) ................................ 2010-183892

(51) Int. Cl.
*C01B 35/02*  (2006.01)
*C01B 35/04*  (2006.01)
*C04B 14/32*  (2006.01)
(Continued)

(52) U.S. Cl.
CPC ............... *C01B 35/04* (2013.01); *C01D 13/00* (2013.01); *C04B 14/321* (2013.01); *C04B 35/5805* (2013.01); *C04B 35/64* (2013.01); *C30B 9/10* (2013.01); *C30B 29/10* (2013.01); *C04B 2235/3201* (2013.01); *C04B 2235/40* (2013.01); *C04B 2235/422* (2013.01); *C04B 2235/424* (2013.01); *C04B 2235/428* (2013.01); *C04B 2235/5436* (2013.01); *C04B 2235/6584* (2013.01); *C04B 2235/767* (2013.01); *C04B 2235/77* (2013.01); *C04B 2235/786* (2013.01)

(58) Field of Classification Search
None
See application file for complete search history.

(56) References Cited

FOREIGN PATENT DOCUMENTS

JP      01100294 A  *  4/1989
JP      04280983 A  * 10/1992
(Continued)

OTHER PUBLICATIONS

Morito et al, "Synthesis and crystal structure of sodium borosilicide, Na8B74.5Si17.5" 2010, Dalton Trans. Issue 39 pp. 10197-10202.*
(Continued)

*Primary Examiner* — Anthony J Zimmer
*Assistant Examiner* — Justin Bova
(74) *Attorney, Agent, or Firm* — Wenderoth, Lind & Ponack, L.L.P.

(57) ABSTRACT

Provided are: a novel bonds useful as a highly-functional material; and a novel production method for a polycrystalline sintered product of a bonds, of which the energy cost is low, which does not require a sintering promoter, which enables the product to be worked into complicated forms and which enables a development to a polynary boride.
Provided are a boride having a composition Na—Si—B, and a polycrystalline reaction-sintered product thereof. A mixed compact of boron and an element, M (M means Si and/or C) is heated along with metal sodium to give a polycrystalline reaction-sintered product.

2 Claims, 5 Drawing Sheets

(51) Int. Cl.
*C01D 13/00* (2006.01)
*C04B 35/58* (2006.01)
*C04B 35/64* (2006.01)
*C30B 9/10* (2006.01)
*C30B 29/10* (2006.01)

(56) References Cited

FOREIGN PATENT DOCUMENTS

| JP | 2003-137535 | 5/2003 |
|---|---|---|
| JP | 2006-104037 | 4/2006 |

OTHER PUBLICATIONS

Wang et al, "Influence of Surface Treatment of CBN Grits on the Properties of B—Si—Na Vitrified Abrasive Tools" Key Engineering Materials, vols. 259-260 (2004) pp. 55-58.*
Partial English translation of JP 01-100294.*
Partial English translation of JP 04-280983.*
International Search Report issued Oct. 25, 2011 in International (PCT) Application No. PCT/JP2011/068619.
Prabhakar P. Singh, "*Hole-doped, high-temperature superconductors $Li_x BC$, $Na_x BC$ and $C_x$, a coherent-potential-based prediction*", Solid State Communications, vol. 124, 2002, pp. 25-28.
Baltic Boat Conference 2011, for the oral presentation, "Dynamic recrystallization and formation of ultrafine-grained microstructures in biomedical Co—29Cr—6Mo alloy", Jun. 17, 2011.
ECerS XII 12$^{th}$ Conference of the European Ceramic Society, Jun. 21, 2011.
The 9$^{th}$ International Meeting of Pacific Rim Ceramic Societies Incorporating AUSTCERAM 2011 & AFPG9, Final Program, Jul. 14, 2011, Cairns, Australia.
Zakhariev et al., "Properties of polycrystalline boron carbide sintered in the presence of $W_2B_5$ without pressing," Journal of Materials Science Letters, vol. 7, 1988, p. 695-696.
Chae et al., "Pressureless sintering and related reaction phenomena of $Al_2O_3$-doped $B_4C$," Journal of Materials Science, vol. 27, 1992, p. 6335-6340.

* cited by examiner (a)  (b)

(c)  (d)

F I G. 8
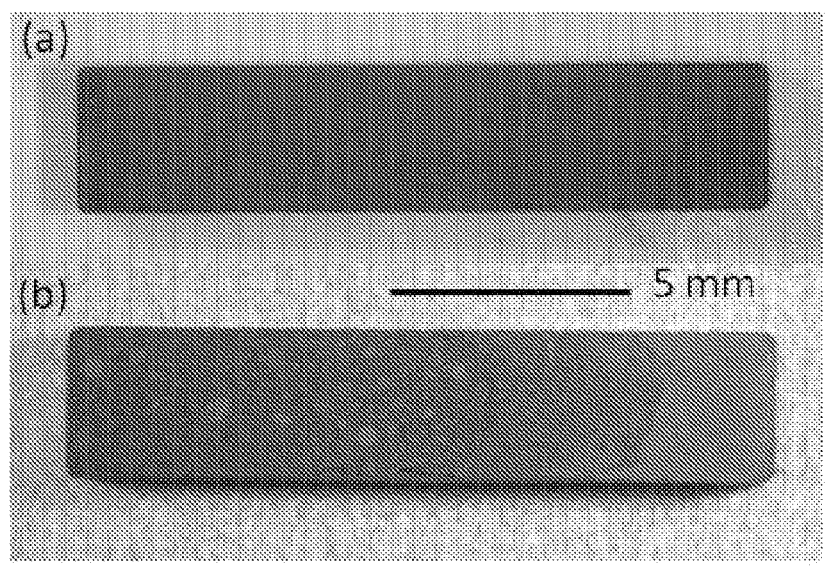
F I G. 9
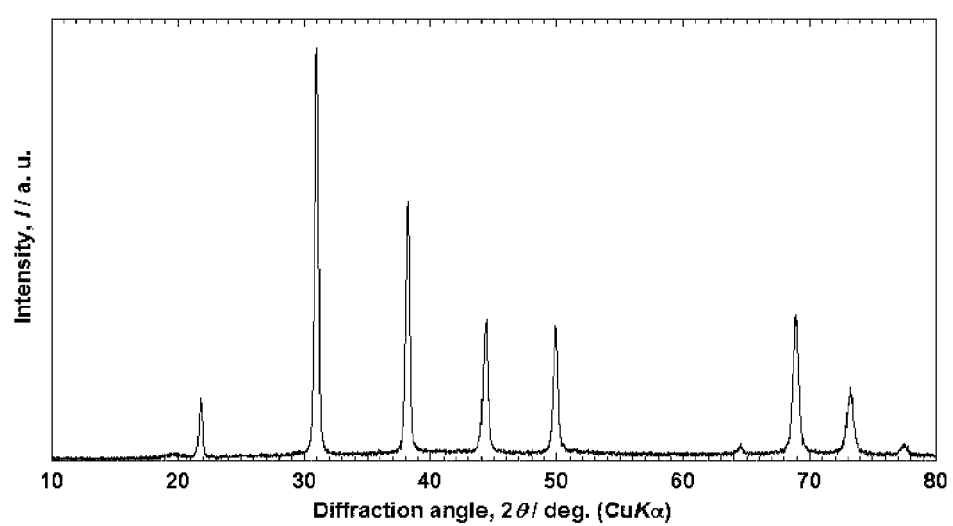

BORIDE HAVING CHEMICAL COMPOSITION NA—SI—B, AND POLYCRYSTALLINE REACTION SINTERED PRODUCT OF BORIDE AND PROCESS FOR PRODUCTION THEREOF

TECHNICAL FIELD

The present invention relates to a novel boride having a composition Na—Si—B, and to a polycrystalline reaction-sintered product of a boride and a method for producing it.

BACKGROUND ART

A boride, in which, in general, the boron atoms bond firmly to each other, has a high hardness, and its melting point or decomposition temperature is high. Accordingly, heretofore, a boride has been used for a heat-resistant material or an abrasion-resistant material. There are known many borides having electrically-specific characteristics such as semiconductor characteristics, thermal electron emission characteristics, superconductivity characteristics, etc. Lanthanum hexaboride ($LaB_6$) has been put into practical use for a hot-cathode material, and magnesium dibromide ($MgB_2$) is specifically noted as a superconductive material.

The electric characteristics of a boride strongly depend on the crystal structure thereof; and a boride having a small boron content exhibits electroconductivity, while a crystal that contains a structure of a boron icosahedron ($B_{12}$ icosahedral cluster) has semiconductive electric characteristics.

Heretofore, as borides, there are known binary borides composed of two component elements such as the above-mentioned $LaB_6$ and $MgB_2$, and also $B_4C$, BN, etc.; and polynary borides with three component elements. As the borides comprising a $B_{12}$ icosahedral cluster, many substances have been discovered, for example, M-Al—B (where M means an alkali metal or an alkaline earth element) (for example, see PTL 1), $RE_{1-x}B_{12}Si_{4-y}$ (RE means one or more rare earth elements selected from Y, Gd, Tb, Dy, Ho, Er, Tm, Yb and Lu; x and y are each fall within a range of $0 \leq x \leq 7$ and $0 \leq y \leq 2$) (for example, see PTL 2), etc.

In addition to application development of such already-existing borides, research and development of a further wide variety of borides to thereby develop highly-functional materials having any other novel function heretofore unknown and capable of being used for various applications has become an important theme.

On the other hand, a boride or a boron-containing carbide is a substance that is difficult to sinter since, in general, the covalent character thereof is strong. At present, as a method for producing a sintered product of a boride such as typically $B_4C$, there is employed a hot isostatic press sintering method (HIP method) or a spark plasma sintering method (SPS method). In any case, the method requires high-temperature and high-pressure conditions, and the polycrystalline products capable of being produced by the sintering method are limited to those having a simple form. In addition, a boride that is a superhard material is difficult to work after production of the polycrystalline products thereof, and the limitation on the form thereof is a significant bar to industrial application of the material.

Apart from the above-mentioned pressure sintering method, a pressureless sintering method using a sintering promoter such as alumina, tungsten carbide or the like has been developed (for example, see NPL 1, 2). However, precipitation of the second phase to be caused by the sintering promoter used in such a sintering method may have some negative influence on the mechanical behavior of borides. In addition, as being carried out at a high temperature around 2000° C., the pressureless sintering method has another problem in that the energy cost thereof is high.

PRIOR ART DOCUMENTS

Patent Documents

Patent Documents 1: JP-A 2006-104037
Patent Documents 2: JP-A 2003-137535

Non-Patent Documents

Non-Patent Documents 1: J. Mater. Sci. Letter, 7 (1988) 695-696
Non-Patent Documents 2: J. Mater. Sci., 27 (1992) 6335-6340

SUMMARY OF THE INVENTION

Problems to be Solved by the Invention

The present invention has been made in consideration of the current situation as mentioned above, and the first object thereof is to provide a novel boride useful as a highly-functional material. The second object is to provide a novel production method for a polycrystalline sintered product of a boride, of which the energy cost is low as compared with that of any other conventional sintering method, which does not require a sintering promoter, which enables the product to be worked into complicated forms and which enables a development to a polynary boride.

Means for Solving the Problems

The boride of the invention is characterized by the following:
(1) A ternary boride having a composition Na—Si—B,
(2) The boride having a composition Na—Si—B of (1), wherein the boride is a compound represented by a general formula $Na_xSi_yB_z$, ($0<x$, $x<y<4x$, $8x<z<20x$).
(3) The boride having a composition Na—Si—B of (1) or (2), wherein the crystal structure of the boride is a hexagonal system or a rhombohedral system.

The polycrystalline reaction-sintered product of a boride and the production method for the product of the invention are characterized by the following:
(4) A polycrystalline reaction-sintered product of a ternary boride having a composition Na-M-B (where M means Si and/or C).
(5) The polycrystalline reaction-sintered product of a boride of (4), wherein the ternary boride is a compound represented by a general formula $Na_xSi_yB_z$ ($0<x$, $x<y<4x$, $8x<z<20x$).
(6) A method for producing a polycrystalline reaction-sintered product of a boride of (4) or (5), which comprises heating a mixed compact of boron and an element, M (where M means Si and/or C) along with a metal sodium.
(7) A method for producing a polycrystalline reaction-sintered product of a boride of (4) or (5), which comprises heating a boron compact along with a metal sodium and an element, M (where M means Si and/or C).
(8) The method for producing a polycrystalline reaction-sintered product of a boride of (6) or (7), wherein the heating temperature is 800° C. or higher.

(9) The method for producing a polycrystalline reaction-sintered product of a boride of any of (6) to (8), wherein the heating is in an inert gas atmosphere.

Effect of the Invention

The boride and the polycrystalline reaction-sintered product of a boride of the invention are unknown and new, and these are industrially-useful materials that are expected to be applicable to heat-resistant materials, abrasion-resistant materials, lightweight structural materials, thermoelectric conversion materials, etc.

The production method for a polycrystalline reaction-sintered product of the invention is a simple production method that comprises mere reaction sintering of a previously-molded, boron (B)-containing compact with any other substance than boron (B), in which it is easy to produce a polycrystalline reaction-sintered product of a boride having a complicated form without adding any foreign element thereto. According to the production method of the invention, various types of novel polynary boride sintered products containing Na and B can be produced in a simplified manner, and therefore the invention provides a direction that is extremely advantageous for research and development of polynary boride sintered products

BRIEF DESCRIPTION OF DRAWINGS

FIG. 8 This shows pictures of the outward appearance of the B/C mixed compact (a) in: Example 5 and a sample of the polycrystalline reaction-sintered product (b) obtained therein.

FIG. 9 This is an X-ray diffraction pattern of a sample of the polycrystalline reaction-sintered product obtained in Example 5.

BEST MODE FOR CARRYING OUT THE INVENTION

Figure 1:
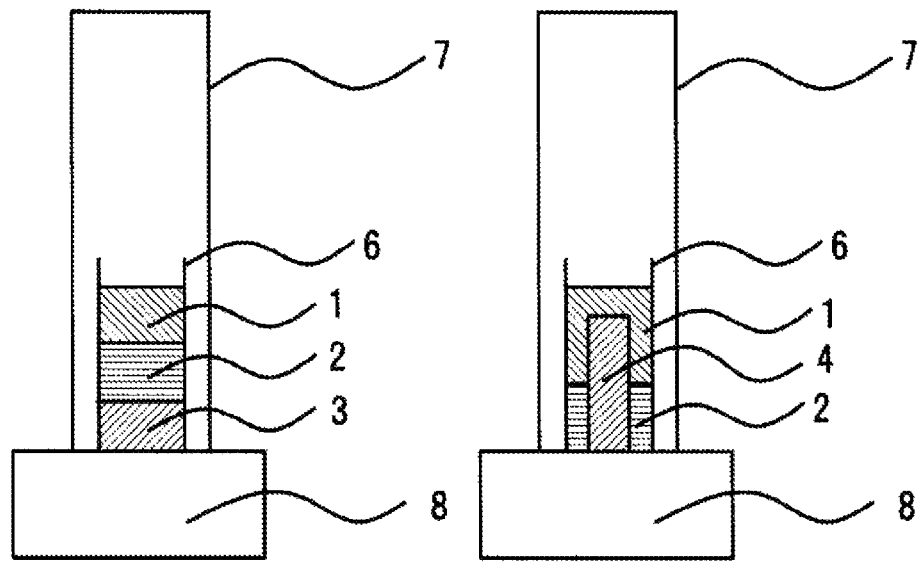
FIG. 1(*a*) is a schematic view of a reactor for producing an Na—Si—B boride to be applied to Example 1 and Example 2. (*b*) is a schematic view of a reactor for producing a polycrystalline reaction-sintered product of an Na—Si—B boride to be applied to Example 3. (*c*) is a schematic view of a reactor for producing a polycrystalline reaction-sintered product of an Na—Si—B boride to be applied to Example 4. (*d*) is a schematic view of a reactor for producing a polycrystalline reaction-sintered product of an Na—C—B boride to be applied to Example 5.
Figure 1:
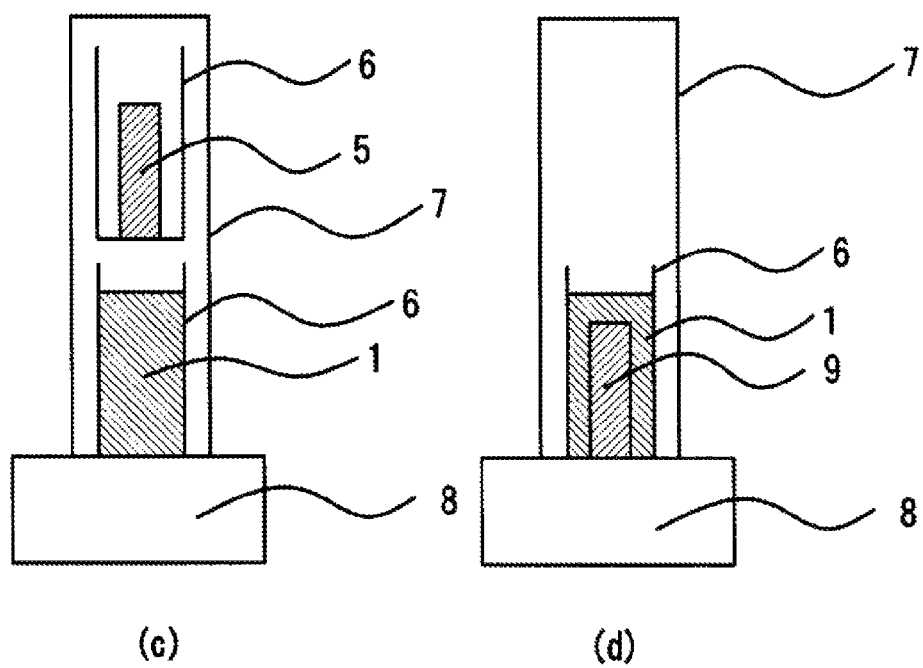

The ternary boride having a composition Na—Si—B {ternary horde containing metal sodium (Na), silicon (Si) and boron (B)} (hereinafter this may be referred to as Na—Si—B boride) of the invention is described concretely. Needless-to-say, the following description is for easy understanding of the concept of the invention and is not for restricting the invention.

<Na—Si—B Boride>

The Na—Si—B boride of the invention is obtained by mixing Na, Si and B followed by heating at a high temperature of generally 800° C. or higher. Needless-to-say, the Na—Si—boride of the invention may be contaminated with minor impurities that are derived from the starting materials and the reactor used not interfering with the production of the boride having a composition Na—Si—B.

Na to be used in the invention may be any known Na and is not specifically defined. Si to be used in the invention may be any known Si and, not specifically defined, any massive or powdery Si can be used here. B to be used in the invention may be any known B, and not specifically defined, any crystalline or amorphous one is usable here.

The stable existence region of the Na—Si—B boride of the invention may be represented by a general formula, $Na_xSi_yB_z$. The value of x is 0<x, preferably 0<x<10; the value of y is x≤y<4x; and the value of z is 8x<z<20x. The crystal structure of the boride belongs to a hexagonal system or a rhombohedral system, including a structure of a boron icosahedron ($B_{12}$ icosahedral cluster). The compound having a typical composition is $Na_8Si_{17.5}B_{74.5}$ with x=8, of which the lattice constants of the hexagonal system are a=1.024±0.008 nm and c=1.092±0.008 nm.

The Na—Si—B boride of the invention is superior to conventional known borides in that the former can provide a crystal having a strength and a hardness on the same level as that of the crystals of the latter at a low temperature.

<Production of Na—Si—B Boride>

The Na—Si—B boride of the invention can be obtained, in general, by putting the components of the above-mentioned Na, Si and B in a specific blend ratio as rough standards, into a reactor, then sealing up the reactor along with an inert gas also put thereinto, and heating them therein.

The blend ratio of the components of Na, Si and B is generally in a range of (1 to 10)/(0.1 to 5)/(0.1 to 10) as the ratio by mol of Na/Si/B, and for example, the blend ratio may be 5/1/6 by mol. The inert gas to be put into the reactor may be any gas with low chemical reactivity and, not specifically defined, includes rare gases, nitrogen gas, etc. In the invention, argon gas is especially preferably used.

The method for supplying Na is not specifically defined, for which is employable a supply method of vapor supply, melt supply, etc.

Regarding the heating condition, the heating temperature may be 800° C. or higher, preferably from 800° C. to 1200° C., and the heating time may be from 1 to 48 hours, preferably 24 hours. The heating condition enables sufficient reaction of the components in the reactor.

The condition of the heating time mentioned above is one based on the crystal size and the blend amount of B used in Examples given below, and in case where the crystal size and the blend amount of B are smaller than those in Examples, the heating time could be shorter than the above-mentioned condition for sufficient reaction.

In the reactor after the reaction, there may exist some residues such as NaSi compounds and others in addition to the Na—Si—B boride compound of the invention; and by removing the other substances than the Na—Si—B boride compound through washing with ethanol and distilled water, the Na—Si—B boride compound of the invention can be obtained.

The crystal structure of the Na—Si—B boride of the invention mentioned above may be a hexagonal system when an amorphous powder B is used and reacted at a temperature lower than 1000° C. or when a crystalline B is used, or may be a rhombohedral system when an amorphous powder B is used and reacted at 1000° C. or higher.

<Polycrystalline Reaction-Sintered Product of Na-M-B Boride (where M is Si and/or C)>

The polycrystalline reaction-sintered product of an Na-M-B boride (where M means Si and/or C) of the invention (hereinafter this may be referred to as a boride polycrystalline product or a polycrystalline product) can be obtained by sintering the Na—Si—B boride or the like of the invention mentioned above, and has the same composition as that of the starting boride. In producing the reaction-sintered product of the Na-M-B boride (where M means Si and/or C) of the invention, the same as the above-mentioned Na—Si—B boride may be used as the precursor thereof, Various types of borides are usable here, but preferably, compounds represented by a general formula $Na_xSi_yB_z$ are used ($0<x$, $x<y<4x$, $8x<z<20x$).

Any known Na is usable in the production method for the above-mentioned boride polycrystalline product of the invention. The Na supply method for the compact is not specifically defined, for which suitably employable is a method of vapor supply, melt supply, etc. B to be used here may be any ordinary known crystalline or amorphous one. As the element M to constitute the polynary boride along with Na and B, usable here is Si and/or C.

The production method for the boride polycrystalline product of the invention enables production of polynary borides that cover ternary borides composed of three components of Na-M-B and any others combined with multiple elements M. More concretely, the production method may be any of a method for producing a boride polycrystalline product by heating a mixed compact of B and M along with Na, or a method for producing a boride polycrystalline product by heating a B compact along with Na and M.

In the production method for the boride polycrystalline product of the invention, preferably, the compact and the other constituent material are put into a reactor along with an inert gas, and then the reactor is sealed up and heated. Not specifically defined, the inert gas may be any one having low chemical reactivity, and includes rare gases, nitrogen gas, etc. In the invention, argon gas is especially preferably used.

As the indication thereof to be taken into consideration here, the heating temperature may be 800° C. or higher, preferably from 800 to 1200° C., and the heating time may be from 1 to 48 hours, preferably from 20 to 30 hours. The heating condition makes it possible to fully compound and sinter the constitutive components for the boride polycrystalline product in the reactor, thereby giving the boride polycrystalline product of high quality.

The condition of the heating time mentioned above is one for the case where the dimension of the compact to be used is about 2.0 m×3.0 mm×14.0 mm, but in the other case where the dimension of the compact to be used is smaller than in that case, the heating time could be shorter than the above-mentioned condition for sufficient compounding and sintering.

In the reactor after the reaction, there may exist some residues such as other compounds than the boride polycrystalline product of the invention; and by removing the other substances than the boride through washing with ethanol and distilled water, the boride polycrystalline product of the invention can be obtained.

In the production method for the boride polycrystalline product of the invention, used are Si and/or C as the above-mentioned M. C is any ordinary known one, including powdery substances of carbon black, fullerene, etc. Si may also be any ordinary known one, including massive or powdery Si.

Preferred embodiments of the production method for the boride polycrystalline product of the invention are mentioned below, in which Si is used as M to give a boride sintered product, or C is used to give a boride sintered product.

<Production of Na—Si—B Boride Polycrystalline Product (1)>

In the production method using a B compact, first, amorphous B is powdered and compressed to give a B compact. Next, in an inert gas atmosphere, Na and Si are weighed so that the ratio by mol of Na/Si/B could fall, as a rough standard thereof, within a range of (1 to 10)/(0.1 to 5)/(0.1 to 10), more preferably the ratio could be 3/1/1, put into a reactor and sealed up therein, and heated under the condition of the invention mentioned above, and thereafter cooled to give an Na—Si—B boride polycrystalline product.

<Production of Na—Si—B Boride Polycrystalline Product (2)>

In the production method using a B—Si mixed compact, amorphous B and Si are so weighed that the ratio by mol of the two could be, as a rough standard thereof, 4/x (where x is from 1 to 4), and mixed, and then powdered and compressed to give a B—Si mixed compact. Next, in an inert gas atmosphere, the B—Si mixed compact and Na are put in different crucibles, the two crucibles are put into a reactor and sealed up therein, and heated under the condition of the invention mentioned above, and thereafter cooled. In this method, Na is supplied as a vapor phase and compounded with the B—Si mixed compact to give an Na—Si—B boride polycrystalline product.

<Production of Na—C—B Boride Polycrystalline Product>

In the production method using a B—C mixed compact, B and C are so weighed that the ratio by mol of B/C could be, as a rough standard thereof, from 2 to 8, and mixed, and then powdered and compressed to give a B—C mixed compact. Next, in an inert gas atmosphere, the B—C mixed compact and Na are put into a reactor and sealed up therein, and heated under the condition of the invention mentioned above, and thereafter cooled to give an Na—C—B boride polycrystalline product. In the method where the molar ratio B/C is 5, an $NaCB_5$ boride polycrystalline product can be produced.

In the boride polycrystalline product production method of the invention, the compact to be prepared through powdering followed by compression may be made to have any desired form, and therefore in the method, it is easy to produce a polycrystalline reaction-sintered product of a boride having a complicated form that has theretofore been extremely difficult to produce according to sintering methods. In addition, the method does not require any high-temperature high-pressure condition such as that in a hot isostatic press sintering method (HIP method) or a spark plasma sintering method (SPS method) heretofore employed for production of sintered products, and does not require any sintering promoter used in pressureless sintering methods, and therefore in the method, a high-quality boride polycrystalline product can be produced at low energy cost.

EXAMPLES

Next, the Na—Si—B boride and the polycrystalline reaction-sintered product of an Na-M-B boride (where M means Si and/or C) of the invention are described concretely with reference to Examples; however, the invention is not whatsoever restricted by the following Examples.

Example 1

In a glove box having therein a high-purity argon gas atmosphere (in which the concentration of $O_2$ and $H_2O$ was less than 1 ppm each), 0.09 g of Na (by Nippon Soda, having a purity of 99.95%), 0.02 g of powdery Si (by Kojundo Chemical Laboratory, having a purity of 99.999% and a particle size of less than 75 μm), and 0.05 g of crystalline B (by Wako Pure Chemicals, having a purity of 99.5%) were so weighed that the ratio by mol of Na/Si/B could be 5/1/6.

Next, as shown in FIG. 1(a), the weighed Na1, Si2 and B3 were put into a BN crucible 6. The BN crucible 6 used here is a sintering BN crucible (by Showa Denko).

The BN sintering crucible 6 was set inside a reactor 7 (made of stainless SUS316), and the reactor 7 was sealed up with a cap 8 made of stainless in a high-purity argon atmosphere. The reactor 7 used here has an inner diameter of 10 mm and an outer diameter of 80 mm. Subsequently, the reactor 7 was set in an electric furnace, and heated up to 800 to 1200° C. taking 2 hours, then left as such for 24 hours, and thereafter cooled to room temperature, and the reactor 7 was taken out.

The reactor 7 was cut in the globe box, and the BN crucible 6 was taken out. Inside the crucible, there existed a mixture of black powdery substance and a silver substance. The formed silver substance was analyzed through X-ray diffractometry (using Rigaku's "Rint" (trade name) with a radiation source of CuKα), by which the substance was identified as one mainly comprising an intermetallic compound of NaSi (compositional ratio 1/1) and Na.

The mixture obtained in the above was washed with ethanol and distilled water to thereby remove the NaSi compound and Na. After the washing, the remaining black crystal substance was recovered.

Figure 2:
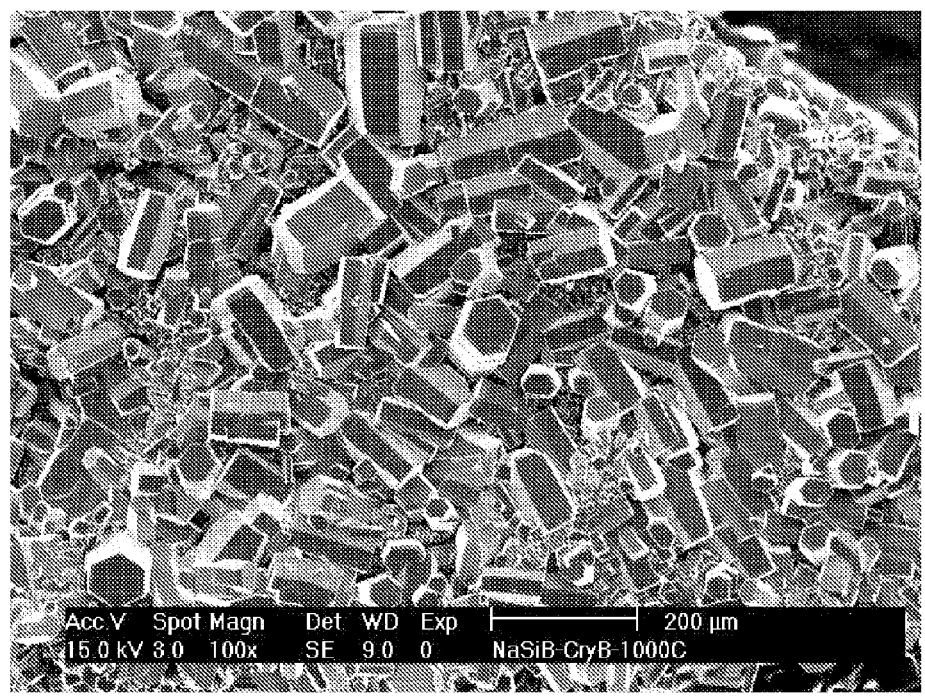
FIG. 2 This is a scanning electron-microscopic (SEM) picture of a crystal sample of the Na—Si—B boride obtained in Example 1.

Next, a scanning electron-microscopic (SEM) picture of a crystal sample obtained by heating Na, Si and crystalline B at 1000° C. is shown in FIG. 2. The observed crystals are hexagonal columns and have a size of from about tens to 200 μm.

Of the above sample, a single crystal having a size of about 100 μm was cut out, and the single crystal was analyzed through X-ray diffractometry using a single-crystal X-ray diffractometry apparatus (Rigaku's "RAPID" (trade name) with a radiation source of MoKα) equipped with an imaging plate. The X-ray diffraction spots confirmed that the obtained crystal sample was a hexagonal system crystal having a space group of P6$_3$/mmc and lattice constants of a=1.024±0.008 nm and c=1.092±0.008 nm.

In the crystal, the boron icosahedrons (B$_{12}$ icosahedral cluster) formed a three-dimensional network.

Tables 1 to 4 show the results obtained from the single-crystal X-ray diffractiometry data of the Na—Si—B boride of Example 1.

TABLE 1

X-Ray Diffraction Data of Example 1

| h | k | l | 2θ | d | I$_{obs}$ |
|---|---|---|------|--------|-----|
| 1 | 0 | 0 | 9.963 | 8.8710 | 20 |
| 1 | 0 | 1 | 12.862 | 6.8772 | 1 |
| 0 | 0 | 2 | 16.269 | 5.4439 | 2 |
| 1 | 1 | 0 | 17.300 | 5.1217 | 3 |
| 1 | 0 | 2 | 19.113 | 4.6399 | 15 |
| 2 | 0 | 0 | 20.002 | 4.4355 | 6 |
| 2 | 0 | 1 | 21.617 | 4.1077 | 18 |
| 1 | 1 | 2 | 23.835 | 3.7303 | 0 |
| 2 | 0 | 2 | 25.890 | 3.4386 | 46 |
| 1 | 0 | 3 | 26.514 | 3.3590 | 14 |
| 2 | 1 | 0 | 26.564 | 3.3529 | 1 |
| 2 | 1 | 1 | 27.819 | 3.2044 | 34 |
| 3 | 0 | 0 | 30.200 | 2.8570 | 2 |
| 2 | 1 | 2 | 31.307 | 2.8549 | 30 |
| 3 | 0 | 1 | 31.321 | 2.8536 | 51 |

TABLE 1-continued

X-Ray Diffraction Data of Example 1

| h | k | l | 2θ | d | I$_{obs}$ |
|---|---|---|------|--------|-----|
| 2 | 0 | 3 | 31.834 | 2.8088 | 48 |
| 0 | 0 | 4 | 32.878 | 2.7219 | 28 |
| 1 | 0 | 4 | 34.437 | 2.6022 | 31 |
| 3 | 0 | 2 | 34.469 | 2.5984 | 5 |
| 2 | 2 | 0 | 35.011 | 2.5608 | 70 |
| 2 | 1 | 3 | 36.453 | 2.4628 | 35 |
| 3 | 1 | 0 | 36.490 | 2.4604 | 16 |
| 1 | 1 | 4 | 37.384 | 2.4036 | 2 |
| 3 | 1 | 1 | 37.444 | 2.3999 | 13 |
| 2 | 0 | 4 | 38.785 | 2.3199 | 11 |
| 2 | 2 | 2 | 38.831 | 2.3172 | 100 |
| 3 | 0 | 3 | 39.269 | 2.2924 | 23 |
| 3 | 1 | 2 | 40.189 | 2.2420 | 5 |
| 4 | 0 | 0 | 40.649 | 2.2177 | 9 |
| 4 | 0 | 1 | 41.521 | 2.1731 | 2 |
| 1 | 0 | 5 | 42.723 | 2.1148 | 23 |
| 2 | 1 | 4 | 42.755 | 2.1132 | 2 |
| 4 | 0 | 2 | 44.055 | 2.0539 | 1 |
| 3 | 1 | 3 | 44.450 | 2.0365 | 8 |
| 3 | 2 | 0 | 44.481 | 2.0351 | 64 |
| 3 | 0 | 4 | 45.243 | 2.0027 | 0 |
| 3 | 2 | 1 | 46.294 | 2.0005 | 9 |
| 2 | 0 | 5 | 46.417 | 1.9547 | 29 |
| 4 | 1 | 0 | 46.897 | 1.9358 | 7 |
| 3 | 2 | 2 | 47.667 | 1.9063 | 1 |
| 4 | 1 | 1 | 47.677 | 1.9059 | 2 |
| 4 | 0 | 3 | 48.039 | 1.8924 | 4 |
| 2 | 2 | 4 | 48.787 | 1.8651 | 3 |
| 2 | 1 | 5 | 49.897 | 1.8262 | 36 |
| 3 | 1 | 4 | 49.925 | 1.8252 | 9 |
| 4 | 1 | 2 | 49.964 | 1.8239 | 0 |
| 0 | 0 | 6 | 50.237 | 1.8146 | 2 |
| 1 | 0 | 6 | 51.352 | 1.7778 | 0 |
| 3 | 2 | 3 | 51.437 | 1.7751 | 1 |
| 5 | 0 | 0 | 51.465 | 1.7742 | 1 |
| 3 | 0 | 5 | 52.120 | 1.7534 | 11 |
| 5 | 0 | 1 | 52.194 | 1.7511 | 7 |
| 4 | 0 | 4 | 53.234 | 1.7183 | 1 |
| 1 | 1 | 6 | 53.532 | 1.7104 | 0 |
| 4 | 1 | 3 | 53.614 | 1.7080 | 0 |
| 3 | 3 | 0 | 53.641 | 1.7072 | 26 |
| 5 | 0 | 2 | 54.341 | 1.6869 | 2 |
| 2 | 0 | 6 | 54.600 | 1.6795 | 1 |
| 4 | 2 | 0 | 54.707 | 1.6765 | 2 |
| 4 | 2 | 1 | 55.407 | 1.6569 | 3 |
| 3 | 1 | 5 | 56.380 | 1.6306 | 0 |
| 3 | 2 | 4 | 56.406 | 1.6299 | 39 |
| 3 | 3 | 2 | 56.441 | 1.6290 | 0 |
| 4 | 2 | 2 | 57.472 | 1.6022 | 2 |
| 2 | 1 | 6 | 57.721 | 1.5959 | 12 |
| 5 | 0 | 3 | 57.798 | 1.5939 | 1 |
| 5 | 1 | 0 | 57.824 | 1.5933 | 1 |
| 4 | 1 | 4 | 58.457 | 1.5775 | 2 |
| 5 | 1 | 1 | 58.500 | 1.5765 | 11 |
| 4 | 0 | 5 | 59.440 | 1.5539 | 2 |
| 3 | 0 | 6 | 59.742 | 1.5466 | 9 |
| 1 | 0 | 7 | 60.371 | 1.5320 | 0 |
| 5 | 1 | 2 | 60.497 | 1.5291 | 1 |
| 4 | 2 | 3 | 60.813 | 1.5219 | 3 |
| 3 | 2 | 5 | 62.406 | 1.4869 | 1 |
| 5 | 0 | 4 | 62.431 | 1.4663 | 0 |
| 2 | 2 | 6 | 62.700 | 1.4806 | 1 |
| 6 | 0 | 0 | 62.799 | 1.4785 | 17 |
| 2 | 0 | 7 | 63.311 | 1.4678 | 0 |
| 6 | 0 | 1 | 63.442 | 1.4651 | 2 |
| 3 | 1 | 6 | 63.668 | 1.4604 | 4 |
| 5 | 1 | 3 | 63.742 | 1.4589 | 4 |
| 4 | 3 | 0 | 63.766 | 1.4584 | 1 |
| 4 | 1 | 5 | 64.339 | 1.4468 | 3 |
| 3 | 3 | 4 | 64.363 | 1.4483 | 21 |
| 4 | 3 | 1 | 64.404 | 1.4455 | 9 |
| 4 | 2 | 4 | 65.318 | 1.4274 | 13 |
| 6 | 0 | 2 | 65.350 | 1.4268 | 0 |
| 5 | 2 | 0 | 65.677 | 1.4205 | 0 |
| 2 | 1 | 7 | 66.177 | 1.4110 | 10 |
| 4 | 3 | 2 | 66.297 | 1.4087 | 1 |

TABLE 1-continued

X-Ray Diffraction Data of Example 1

| h | k | l | 2θ | d | $I_{obs}$ |
|---|---|---|------|--------|---|
| 5 | 2 | 1 | 66.305 | 1.4066 | 2 |
| 4 | 0 | 6 | 66.526 | 1.4044 | 1 |
| 3 | 0 | 7 | 66.053 | 1.3766 | 1 |
| 5 | 0 | 5 | 66.116 | 1.3755 | 34 |
| 5 | 1 | 4 | 68.140 | 1.3750 | 0 |
| 5 | 2 | 2 | 68.171 | 1.3745 | 0 |
| 6 | 0 | 3 | 68.468 | 1.3692 | 1 |
| 0 | 0 | 8 | 68.943 | 1.3610 | 0 |
| 3 | 2 | 6 | 69.324 | 1.3544 | 0 |
| 4 | 3 | 3 | 69.394 | 1.3532 | 20 |
| 6 | 1 | 0 | 69.418 | 1.3528 | 0 |
| 1 | 0 | 8 | 69.866 | 1.3452 | 6 |
| 6 | 1 | 1 | 70.029 | 1.3425 | 3 |
| 4 | 2 | 5 | 70.884 | 1.3284 | 1 |
| 4 | 1 | 6 | 71.160 | 1.3239 | 0 |
| 5 | 2 | 3 | 71.230 | 1.3228 | 1 |
| 1 | 1 | 8 | 71.696 | 1.3153 | 1 |
| 3 | 1 | 7 | 71.734 | 1.3147 | 3 |
| 6 | 1 | 2 | 71.850 | 1.3129 | 0 |
| 2 | 0 | 6 | 72.603 | 1.3011 | 2 |
| 6 | 0 | 4 | 72.726 | 1.2992 | 1 |
| 5 | 1 | 5 | 73.606 | 1.2858 | 3 |
| 4 | 3 | 4 | 73.629 | 1.2855 | 0 |
| 4 | 4 | 0 | 73.969 | 1.2804 | 3 |
| 4 | 0 | 7 | 74.444 | 1.2734 | 0 |
| 5 | 0 | 6 | 74.775 | 1.2686 | 7 |
| 6 | 1 | 3 | 74.843 | 1.2676 | 0 |
| 7 | 0 | 0 | 74.866 | 1.2673 | 2 |
| 5 | 3 | 0 | 74.866 | 1.2673 | 0 |
| 2 | 1 | 8 | 75.301 | 1.2610 | 0 |
| 5 | 2 | 4 | 75.422 | 1.2593 | 0 |
| 5 | 3 | 1 | 75.460 | 1.2588 | 7 |
| 7 | 0 | 1 | 75.460 | 1.2588 | 0 |
| 4 | 4 | 2 | 76.343 | 1.2464 | 3 |
| 3 | 3 | 6 | 76.559 | 1.2434 | 0 |
| 3 | 0 | 8 | 77.080 | 1.2363 | 1 |
| 3 | 2 | 7 | 77.118 | 1.2358 | 2 |
| 7 | 0 | 2 | 77.230 | 1.2343 | 0 |
| 5 | 3 | 2 | 77.230 | 1.2343 | 1 |
| 4 | 2 | 6 | 77.446 | 1.2314 | 1 |
| 6 | 2 | 0 | 77.536 | 1.2302 | 0 |
| 6 | 0 | 5 | 78.063 | 1.2232 | 2 |
| 6 | 2 | 1 | 78.122 | 1.2224 | 8 |
| 4 | 1 | 7 | 78.885 | 1.2125 | 0 |
| 4 | 3 | 5 | 78.944 | 1.2117 | 3 |
| 6 | 1 | 4 | 78.967 | 1.2114 | 0 |
| 2 | 2 | 8 | 79.727 | 1.2018 | 9 |
| 6 | 2 | 2 | 79.875 | 1.1999 | 3 |
| 1 | 0 | 9 | 79.977 | 1.1987 | 2 |
| 5 | 1 | 6 | 80.089 | 1.1973 | 4 |

TABLE 2

Crystal data and structure refinement for $Na_6Si_{17.5}B_{74.5}$.

| | |
|---|---|
| Empirical formula | $Na_6Si_{17.5}B_{74.5}$ |
| Temperature | 293(2) K |
| Wavelength | 0.71075 Å |
| Crystal system, space group | hexagonal, P6$_3$/mmc |
| Unit cell dimensions | a = 10.2392(3) Å    alpha = 90 deg. |
| | b = 10.2392(3) Å    beta = 90 deg. |
| | c = 10.9215(4) Å    gamma = 120 deg. |
| Absorption coefficient | 0.690 mm$^{-1}$ |
| Limiting indices | $-13 \leq h \leq 13$, $-13 \leq k \leq 13$, $-14 \leq l \leq 13$ |
| Refinement method | Full-matrix least-squares on F$^2$ |
| Data/restraints/parameters | 467/1/52 |
| Goodness-of-fit on F$^2$ | 1.139 |
| Final R indices [I > 2sigma(I)] | R1 = 0.0389, wR2 = 0.0938 |
| R indices (all data) | R1 = 0.0439, wR2 = 0.0965 |
| Largest diff. peak and hole | 0.919 and $-0.455$ e·Å$^{-3}$ |

TABLE 3

Atomic coordinates (×10$^4$) and equivalent isotropic displacement parameters (Å$^2$ × 10$^3$) for $Na_6Si_{17.5}B_{74.5}$. $U_{(eq)}$ is defined as one third of the trace of the orthogonalized $U_{ij}$ tensor.

| | x | y | z | U$_{(eq)}$ |
|---|---|---|---|---|
| Na(1) | 1665(1) | 3331(2) | 2500 | 16(1) |
| Na(2) | 3333 | 6667 | 2500 | 15(1) |
| B(1) | 3763(3) | 340(3) | 762(2) | 11(1) |
| B(2) | 1575(3) | 4893(3) | 504(2) | 11(1) |
| B(3) | 5187(2) | 373(4) | 6654(3) | 7(1) |
| B(4) | 5748(2) | 1497(5) | 942(3) | 13(1) |
| B(5) | 3333 | 6667 | 6500(20) | 16(2) |
| Si(1) | 3333 | 6667 | 6844(6) | 16(2) |
| Si(2) | 1300(1) | 2600(1) | 6421(1) | 9(1) |
| Si(3) | 0 | 0 | 1053(2) | 11(1) |

TABLE 4-1

Observed and calculated structure factors for $Na_6Si_{17.5}B_{74.5}$

| h | k | l | 10Fa | 10Fc | 10s |
|---|---|---|------|------|-----|
| −1 | 2 | 0 | 127 | 113 | 1 |
| 0 | 2 | 0 | 230 | 187 | 1 |
| −1 | 3 | 0 | 92 | 69 | 1 |
| 0 | 3 | 0 | 170 | 153 | 2 |
| −2 | 4 | 0 | 1337 | 1361 | 9 |
| −1 | 4 | 0 | 482 | 472 | 2 |
| 0 | 4 | 0 | 531 | 537 | 3 |
| −2 | 5 | 0 | 1145 | 1171 | 5 |
| −1 | 5 | 0 | 349 | 376 | 1 |
| 0 | 5 | 0 | 272 | 284 | 2 |
| −3 | 6 | 0 | 1303 | 1323 | 10 |
| −2 | 6 | 0 | 279 | 277 | 2 |
| −1 | 6 | 0 | 181 | 172 | 2 |
| 0 | 6 | 0 | 1279 | 1305 | 10 |
| −3 | 7 | 0 | 169 | 160 | 3 |
| −2 | 7 | 0 | 37 | 29 | 5 |
| −1 | 7 | 0 | 27 | 42 | 9 |
| 0 | 7 | 0 | 577 | 600 | 4 |
| −4 | 8 | 0 | 654 | 632 | 5 |
| −3 | 8 | 0 | 34 | 28 | 7 |
| −2 | 8 | 0 | 36 | 22 | 6 |
| −1 | 8 | 0 | 684 | 692 | 3 |
| 0 | 8 | 0 | 773 | 772 | 6 |
| −4 | 9 | 0 | 256 | 263 | 3 |
| −3 | 9 | 0 | 54 | 53 | 5 |
| −2 | 9 | 0 | 29 | 18 | 10 |
| −1 | 9 | 0 | 531 | 528 | 5 |
| 0 | 9 | 0 | 242 | 235 | 8 |
| −5 | 10 | 0 | 1105 | 1089 | 11 |
| −4 | 10 | 0 | 323 | 321 | 4 |
| −3 | 10 | 0 | 152 | 157 | 5 |
| −2 | 10 | 0 | 85 | 91 | 5 |
| −1 | 10 | 0 | 34 | 22 | 22 |
| 0 | 10 | 0 | 441 | 430 | 8 |
| −5 | 11 | 0 | 374 | 365 | 4 |
| −4 | 11 | 0 | 273 | 262 | 6 |
| −3 | 11 | 0 | 94 | 104 | 9 |
| −2 | 11 | 0 | 65 | 66 | 14 |
| −1 | 11 | 0 | 455 | 443 | 7 |
| 0 | 11 | 0 | 347 | 319 | 13 |
| −6 | 12 | 0 | 604 | 595 | 9 |
| −5 | 12 | 0 | 49 | 55 | 21 |
| −4 | 12 | 0 | 144 | 145 | 7 |
| −3 | 12 | 0 | 292 | 293 | 7 |
| −2 | 12 | 0 | 309 | 300 | 7 |
| −6 | 13 | 0 | 163 | 192 | 16 |
| −5 | 13 | 0 | 104 | 138 | 13 |
| 0 | 3 | 2 | 250 | 239 | 2 |
| −2 | 4 | 2 | 1315 | 1275 | 6 |
| −1 | 4 | 2 | 224 | 225 | 1 |
| 0 | 4 | 2 | 204 | 219 | 2 |
| −2 | 5 | 2 | 123 | 105 | 1 |
| −1 | 5 | 2 | 59 | 40 | 2 |
| 0 | 5 | 2 | 237 | 237 | 3 |

TABLE 4-1-continued

Observed and calculated structure factors for $Na_8Si_{1.75}B_{74.5}$

| h | k | l | 10Fa | 10Fc | 10s |
|---|---|---|------|------|-----|
| -3 | 6 | 2 | 75 | 85 | 3 |
| -2 | 6 | 2 | 205 | 231 | 1 |
| -1 | 6 | 2 | 119 | 110 | 2 |
| 0 | 6 | 2 | 113 | 100 | 4 |
| -3 | 7 | 2 | 114 | 117 | 2 |
| -2 | 7 | 2 | 106 | 91 | 1 |
| -1 | 7 | 2 | 39 | 25 | 5 |
| 0 | 7 | 2 | 57 | 63 | 6 |
| -4 | 8 | 2 | 418 | 432 | 3 |
| -3 | 8 | 2 | 248 | 259 | 2 |
| -2 | 8 | 2 | 375 | 366 | 2 |
| -1 | 8 | 2 | 164 | 164 | 3 |
| 0 | 8 | 2 | 99 | 110 | 6 |
| -4 | 9 | 2 | 80 | 78 | 3 |
| -3 | 9 | 2 | 23 | 18 | 8 |
| -2 | 9 | 2 | 215 | 213 | 3 |
| -1 | 9 | 2 | 164 | 163 | 3 |
| 0 | 9 | 2 | 45 | 42 | 9 |
| -5 | 10 | 2 | 109 | 110 | 4 |
| -4 | 10 | 2 | 100 | 105 | 3 |
| -3 | 10 | 2 | 41 | 38 | 8 |
| -2 | 10 | 2 | 354 | 343 | 3 |
| -1 | 10 | 2 | 73 | 73 | 5 |
| 0 | 10 | 2 | 80 | 95 | 8 |
| -5 | 11 | 2 | 43 | 45 | 6 |
| -4 | 11 | 2 | 129 | 145 | 4 |
| -3 | 11 | 2 | 230 | 220 | 4 |
| -2 | 11 | 2 | 133 | 152 | 5 |
| -1 | 11 | 2 | 162 | 169 | 7 |
| 0 | 11 | 2 | 40 | 11 | 25 |
| -6 | 12 | 2 | 56 | 40 | 13 |
| -5 | 12 | 2 | 10 | 6 | 9 |
| -4 | 12 | 2 | 160 | 184 | 6 |
| -3 | 12 | 2 | 192 | 212 | 7 |
| -2 | 12 | 2 | 63 | 56 | 19 |
| -6 | 13 | 2 | 57 | 62 | 9 |
| -5 | 13 | 2 | 15 | 10 | 15 |
| 0 | 1 | 3 | 315 | 330 | 1 |
| 0 | 2 | 3 | 689 | 689 | 3 |
| -1 | 3 | 3 | 455 | 468 | 1 |
| -2 | 5 | 4 | 855 | 884 | 3 |
| -1 | 5 | 4 | 142 | 140 | 2 |
| 0 | 5 | 4 | 67 | 44 | 5 |
| -3 | 6 | 4 | 990 | 999 | 5 |
| -2 | 6 | 4 | 629 | 643 | 2 |
| -1 | 6 | 4 | 41 | 30 | 5 |
| 0 | 6 | 4 | 314 | 299 | 3 |
| -3 | 7 | 4 | 61 | 64 | 3 |
| -2 | 7 | 4 | 61 | 65 | 4 |
| -1 | 7 | 4 | 160 | 153 | 2 |
| 0 | 7 | 4 | 693 | 688 | 5 |
| -4 | 8 | 4 | 82 | 77 | 4 |
| -3 | 8 | 4 | 93 | 84 | 2 |
| -2 | 8 | 4 | 246 | 235 | 3 |
| -1 | 8 | 4 | 550 | 540 | 3 |
| 0 | 8 | 4 | 871 | 858 | 5 |
| -4 | 9 | 4 | 253 | 249 | 2 |
| -3 | 9 | 4 | 74 | 77 | 4 |
| -2 | 9 | 4 | 0 | 9 | 1 |
| -1 | 9 | 4 | 356 | 346 | 3 |
| 0 | 9 | 4 | 268 | 258 | 5 |
| -5 | 10 | 4 | 655 | 678 | 12 |
| -4 | 10 | 4 | 576 | 563 | 3 |
| -3 | 10 | 4 | 85 | 90 | 5 |
| -2 | 10 | 4 | 242 | 233 | 4 |
| -1 | 10 | 4 | 0 | 3 | 1 |
| 0 | 10 | 4 | 46 | 46 | 14 |
| -5 | 11 | 4 | 462 | 459 | 4 |
| -4 | 11 | 4 | 53 | 58 | 7 |
| -3 | 11 | 4 | 37 | 24 | 12 |
| -2 | 11 | 4 | 34 | 37 | 14 |
| -1 | 11 | 4 | 107 | 119 | 6 |
| 0 | 11 | 4 | 58 | 82 | 18 |
| -6 | 12 | 4 | 122 | 103 | 8 |
| -5 | 12 | 4 | 107 | 116 | 6 |
| -4 | 12 | 4 | 32 | 35 | 17 |
| -3 | 12 | 4 | 315 | 304 | 4 |
| 0 | 1 | 5 | 695 | 693 | 3 |
| 0 | 2 | 5 | 821 | 832 | 4 |
| -1 | 3 | 5 | 724 | 729 | 2 |
| 0 | 3 | 5 | 532 | 562 | 3 |
| -1 | 4 | 5 | 127 | 121 | 1 |
| 0 | 4 | 5 | 302 | 316 | 2 |
| -2 | 5 | 5 | 139 | 134 | 2 |
| -1 | 5 | 5 | 286 | 286 | 1 |
| 0 | 5 | 5 | 1366 | 1386 | 8 |
| -2 | 6 | 5 | 157 | 159 | 1 |
| 0 | 7 | 6 | 45 | 37 | 10 |
| -4 | 8 | 6 | 479 | 469 | 4 |
| -3 | 8 | 6 | 400 | 404 | 2 |
| -2 | 8 | 6 | 216 | 215 | 3 |
| -1 | 8 | 6 | 240 | 222 | 3 |
| 0 | 8 | 6 | 308 | 310 | 5 |
| -4 | 9 | 6 | 92 | 102 | 3 |
| -3 | 9 | 6 | 175 | 174 | 5 |
| -2 | 9 | 6 | 336 | 329 | 3 |
| -1 | 9 | 6 | 185 | 183 | 5 |
| 0 | 9 | 6 | 49 | 56 | 14 |
| -5 | 10 | 6 | 392 | 372 | 6 |
| -4 | 10 | 6 | 105 | 104 | 4 |
| -3 | 10 | 6 | 58 | 70 | 8 |
| -2 | 10 | 6 | 260 | 249 | 4 |
| -1 | 10 | 6 | 140 | 146 | 6 |
| 0 | 10 | 6 | 41 | 30 | 19 |
| -5 | 11 | 6 | 0 | 13 | 1 |
| -4 | 11 | 6 | 209 | 212 | 9 |
| -3 | 11 | 6 | 402 | 391 | 5 |
| -2 | 11 | 6 | 258 | 256 | 5 |
| -6 | 12 | 6 | 194 | 209 | 17 |
| 0 | 1 | 7 | 50 | 18 | 3 |
| 0 | 2 | 7 | 77 | 85 | 2 |
| -1 | 3 | 7 | 472 | 480 | 2 |
| 0 | 3 | 7 | 211 | 209 | 2 |
| -1 | 4 | 7 | 291 | 295 | 2 |
| 0 | 4 | 7 | 37 | 28 | 3 |
| -2 | 5 | 7 | 257 | 250 | 2 |
| -1 | 5 | 7 | 23 | 4 | 9 |
| 0 | 5 | 7 | 158 | 143 | 3 |
| -2 | 6 | 7 | 118 | 118 | 2 |
| -1 | 6 | 7 | 128 | 124 | 3 |
| 0 | 6 | 7 | 61 | 73 | 4 |
| -3 | 7 | 7 | 221 | 217 | 2 |
| -2 | 7 | 7 | 106 | 89 | 3 |
| -1 | 7 | 7 | 67 | 76 | 4 |
| 0 | 7 | 7 | 58 | 56 | 8 |
| -3 | 8 | 7 | 178 | 188 | 4 |
| -2 | 8 | 7 | 0 | 5 | 1 |
| -1 | 8 | 7 | 104 | 109 | 4 |
| 0 | 8 | 7 | 69 | 58 | 9 |
| -4 | 9 | 7 | 76 | 90 | 5 |
| -3 | 9 | 7 | 16 | 4 | 16 |
| -2 | 9 | 7 | 380 | 373 | 4 |
| -1 | 9 | 7 | 294 | 280 | 4 |
| 0 | 9 | 7 | 65 | 80 | 12 |
| -1 | 4 | 9 | 361 | 368 | 2 |
| 0 | 4 | 9 | 79 | 68 | 5 |
| -2 | 5 | 9 | 60 | 66 | 3 |
| -1 | 5 | 9 | 309 | 308 | 2 |
| 0 | 5 | 9 | 400 | 403 | 4 |
| -2 | 6 | 9 | 18 | 6 | 17 |
| -1 | 6 | 9 | 303 | 292 | 2 |
| 0 | 6 | 9 | 284 | 288 | 4 |
| -3 | 7 | 9 | 87 | 84 | 4 |
| -2 | 7 | 9 | 370 | 366 | 3 |
| -1 | 7 | 9 | 208 | 208 | 4 |
| 0 | 7 | 9 | 389 | 364 | 8 |
| -3 | 8 | 9 | 521 | 514 | 4 |
| -2 | 8 | 9 | 445 | 432 | 4 |
| -1 | 8 | 9 | 102 | 117 | 8 |
| 0 | 8 | 9 | 104 | 118 | 15 |
| -4 | 9 | 9 | 68 | 87 | 9 |
| -3 | 9 | 9 | 38 | 45 | 14 |

TABLE 4-1-continued

Observed and calculated structure factors for $Na_8Si_{175}B_{74.5}$

| h | k | l | 10Fa | 10Fc | 10s |
|---|---|---|------|------|-----|
| -2 | 9 | 9 | 110 | 149 | 10 |
| -1 | 9 | 9 | 40 | 45 | 13 |
| -4 | 10 | 9 | 37 | 16 | 25 |
| -3 | 10 | 9 | 441 | 442 | 11 |
| 0 | 8 | 10 | 940 | 899 | 25 |
| 0 | 1 | 10 | 27 | 9 | 27 |
| -1 | 2 | 10 | 335 | 345 | 4 |
| 0 | 2 | 10 | 512 | 518 | 4 |
| -1 | 3 | 10 | 312 | 311 | 2 |
| 0 | 3 | 10 | 565 | 551 | 4 |
| -2 | 4 | 10 | 294 | 286 | 4 |
| -1 | 4 | 10 | 229 | 225 | 3 |
| 0 | 4 | 10 | 374 | 370 | 4 |
| -2 | 5 | 10 | 294 | 290 | 3 |
| -1 | 5 | 10 | 109 | 110 | 4 |
| 0 | 5 | 10 | 640 | 642 | 5 |
| -3 | 6 | 10 | 51 | 35 | 9 |
| -2 | 6 | 10 | 108 | 115 | 4 |
| -1 | 6 | 10 | 453 | 440 | 3 |
| 0 | 6 | 10 | 272 | 270 | 4 |
| -3 | 7 | 10 | 152 | 156 | 4 |
| -2 | 7 | 10 | 413 | 407 | 3 |
| -1 | 7 | 10 | 158 | 164 | 4 |
| 0 | 7 | 10 | 16 | 18 | 16 |
| -4 | 8 | 10 | 276 | 276 | 5 |
| -3 | 8 | 10 | 252 | 250 | 5 |
| -2 | 8 | 10 | 349 | 339 | 5 |
| -1 | 8 | 10 | 84 | 106 | 8 |
| 0 | 8 | 10 | 218 | 222 | 18 |

TABLE 4-2

| h | k | l | 10Fa | 10Fc | 10s |
|---|---|---|------|------|-----|
| 0 | 2 | 1 | 226 | 235 | 1 |
| -1 | 3 | 1 | 414 | 388 | 1 |
| 0 | 3 | 1 | 730 | 726 | 3 |
| -1 | 4 | 1 | 245 | 257 | 1 |
| 0 | 4 | 1 | 243 | 246 | 2 |
| -2 | 5 | 1 | 310 | 286 | 1 |
| -1 | 5 | 1 | 139 | 163 | 1 |
| 0 | 5 | 1 | 502 | 511 | 2 |
| -2 | 6 | 1 | 268 | 267 | 1 |
| -1 | 6 | 1 | 451 | 455 | 1 |
| 0 | 6 | 1 | 339 | 368 | 2 |
| -3 | 7 | 1 | 528 | 536 | 2 |
| -2 | 7 | 1 | 263 | 258 | 1 |
| -1 | 7 | 1 | 290 | 286 | 1 |
| 0 | 7 | 1 | 176 | 148 | 3 |
| -3 | 8 | 1 | 502 | 492 | 2 |
| -2 | 8 | 1 | 579 | 582 | 2 |
| -1 | 8 | 1 | 29 | 9 | 8 |
| 0 | 8 | 1 | 142 | 143 | 3 |
| -4 | 9 | 1 | 61 | 60 | 4 |
| -3 | 9 | 1 | 231 | 230 | 2 |
| -2 | 9 | 1 | 224 | 215 | 3 |
| -1 | 9 | 1 | 106 | 106 | 3 |
| 0 | 9 | 1 | 44 | 42 | 10 |
| -4 | 10 | 1 | 292 | 280 | 2 |
| -3 | 10 | 1 | 277 | 275 | 2 |
| -2 | 10 | 1 | 304 | 299 | 3 |
| -1 | 10 | 1 | 91 | 98 | 4 |
| 0 | 10 | 1 | 705 | 667 | 7 |
| -5 | 11 | 1 | 32 | 28 | 9 |
| -4 | 11 | 1 | 103 | 121 | 3 |
| -3 | 11 | 1 | 234 | 234 | 5 |
| -2 | 11 | 1 | 287 | 289 | 5 |
| -1 | 11 | 1 | 191 | 209 | 5 |
| 0 | 11 | 1 | 104 | 88 | 11 |
| -5 | 12 | 1 | 339 | 340 | 4 |
| -4 | 12 | 1 | 205 | 201 | 6 |
| -3 | 12 | 1 | 9 | 16 | 9 |
| -2 | 12 | 1 | 17 | 21 | 17 |

TABLE 4-2-continued

| h | k | l | 10Fa | 10Fc | 10s |
|---|---|---|------|------|-----|
| -6 | 13 | 1 | 154 | 151 | 8 |
| -5 | 13 | 1 | 341 | 339 | 5 |
| 0 | 0 | 2 | 188 | 185 | 1 |
| 0 | 1 | 2 | 218 | 222 | 1 |
| -1 | 2 | 2 | 56 | 42 | 1 |
| 0 | 2 | 2 | 565 | 586 | 2 |
| -1 | 3 | 2 | 421 | 400 | 1 |
| 0 | 1 | 14 | 79 | 92 | 14 |
| 0 | 3 | 3 | 609 | 600 | 2 |
| -1 | 4 | 3 | 351 | 331 | 1 |
| 0 | 4 | 3 | 321 | 336 | 2 |
| -2 | 5 | 3 | 153 | 148 | 1 |
| -1 | 5 | 3 | 56 | 62 | 3 |
| 0 | 5 | 3 | 164 | 185 | 3 |
| -2 | 6 | 3 | 232 | 237 | 1 |
| -1 | 6 | 3 | 295 | 316 | 2 |
| 0 | 6 | 3 | 234 | 234 | 3 |
| -3 | 7 | 3 | 753 | 775 | 2 |
| -2 | 7 | 3 | 176 | 176 | 2 |
| -1 | 7 | 3 | 48 | 45 | 4 |
| 0 | 7 | 3 | 263 | 278 | 4 |
| -3 | 8 | 3 | 29 | 16 | 6 |
| -2 | 8 | 3 | 23 | 11 | 13 |
| -1 | 8 | 3 | 104 | 98 | 3 |
| 0 | 8 | 3 | 184 | 172 | 5 |
| -4 | 9 | 3 | 114 | 121 | 2 |
| -3 | 9 | 3 | 127 | 132 | 3 |
| -2 | 9 | 3 | 186 | 192 | 3 |
| -1 | 9 | 3 | 7 | 2 | 7 |
| 0 | 9 | 3 | 124 | 123 | 6 |
| -4 | 10 | 3 | 0 | 4 | 1 |
| -3 | 10 | 3 | 79 | 82 | 5 |
| -2 | 10 | 3 | 180 | 179 | 4 |
| -1 | 10 | 3 | 97 | 96 | 5 |
| 0 | 10 | 3 | 320 | 311 | 5 |
| -5 | 11 | 3 | 150 | 154 | 5 |
| -4 | 11 | 3 | 34 | 42 | 10 |
| -3 | 11 | 3 | 326 | 317 | 3 |
| -2 | 11 | 3 | 53 | 55 | 8 |
| -1 | 11 | 3 | 71 | 71 | 8 |
| 0 | 11 | 3 | 26 | 31 | 25 |
| -5 | 12 | 3 | 261 | 253 | 6 |
| -4 | 12 | 3 | 161 | 170 | 7 |
| -3 | 12 | 3 | 47 | 64 | 12 |
| -2 | 12 | 3 | 148 | 159 | 6 |
| 0 | 0 | 4 | 1335 | 1267 | 17 |
| 0 | 1 | 4 | 639 | 652 | 2 |
| -1 | 2 | 4 | 87 | 94 | 2 |
| 0 | 2 | 4 | 477 | 470 | 2 |
| -1 | 3 | 4 | 118 | 104 | 1 |
| 0 | 3 | 4 | 18 | 5 | 10 |
| -2 | 4 | 4 | 287 | 270 | 2 |
| -1 | 4 | 4 | 354 | 371 | 1 |
| 0 | 4 | 4 | 203 | 191 | 1 |
| -1 | 2 | 14 | 366 | 325 | 9 |
| -1 | 6 | 5 | 304 | 296 | 2 |
| 0 | 6 | 5 | 396 | 389 | 3 |
| -3 | 7 | 5 | 345 | 344 | 2 |
| -2 | 7 | 5 | 356 | 359 | 2 |
| -1 | 7 | 5 | 174 | 165 | 2 |
| 0 | 7 | 5 | 36 | 35 | 12 |
| -3 | 8 | 5 | 426 | 434 | 2 |
| -2 | 8 | 5 | 348 | 346 | 3 |
| -1 | 8 | 5 | 102 | 105 | 4 |
| 0 | 8 | 5 | 158 | 146 | 5 |
| -4 | 9 | 5 | 233 | 249 | 3 |
| -3 | 9 | 5 | 176 | 178 | 3 |
| -2 | 9 | 5 | 385 | 387 | 3 |
| -1 | 9 | 5 | 78 | 81 | 5 |
| 0 | 9 | 5 | 29 | 4 | 20 |
| -4 | 10 | 5 | 24 | 9 | 23 |
| -3 | 10 | 5 | 415 | 403 | 3 |
| -2 | 10 | 5 | 346 | 334 | 4 |
| -1 | 10 | 5 | 32 | 20 | 14 |
| 0 | 10 | 5 | 367 | 360 | 5 |
| -5 | 11 | 5 | 479 | 478 | 4 |
| -4 | 11 | 5 | 163 | 175 | 6 |
| -3 | 11 | 5 | 293 | 291 | 5 |

TABLE 4-2-continued

| h | k | l | 10Fa | 10Fc | 10s |
|---|---|---|------|------|-----|
| -2 | 11 | 5 | 93 | 104 | 7 |
| -1 | 11 | 5 | 272 | 266 | 4 |
| -5 | 12 | 5 | 26 | 6 | 25 |
| -4 | 12 | 5 | 185 | 195 | 6 |
| 0 | 0 | 6 | 652 | 623 | 16 |
| 0 | 1 | 6 | 76 | 66 | 2 |
| -1 | 2 | 6 | 117 | 117 | 3 |
| 0 | 2 | 6 | 141 | 156 | 2 |
| -1 | 3 | 6 | 497 | 507 | 2 |
| 0 | 3 | 6 | 606 | 612 | 4 |
| -2 | 4 | 6 | 179 | 161 | 2 |
| -1 | 4 | 6 | 324 | 322 | 1 |
| 0 | 4 | 6 | 181 | 166 | 2 |
| -2 | 5 | 6 | 32 | 31 | 5 |
| -1 | 5 | 6 | 38 | 41 | 3 |
| 0 | 5 | 6 | 689 | 678 | 4 |
| -3 | 6 | 6 | 23 | 15 | 10 |
| -2 | 6 | 6 | 202 | 196 | 2 |
| -1 | 6 | 6 | 394 | 396 | 2 |
| 0 | 6 | 6 | 534 | 540 | 4 |
| -3 | 7 | 6 | 163 | 168 | 2 |
| -2 | 7 | 6 | 287 | 286 | 2 |
| -1 | 7 | 6 | 85 | 71 | 4 |
| -4 | 10 | 7 | 102 | 118 | 7 |
| -3 | 10 | 7 | 226 | 234 | 9 |
| -2 | 10 | 7 | 17 | 16 | 16 |
| -1 | 10 | 7 | 73 | 83 | 8 |
| 0 | 10 | 7 | 134 | 153 | 14 |
| -5 | 11 | 7 | 59 | 86 | 11 |
| -4 | 11 | 7 | 123 | 152 | 11 |
| -3 | 11 | 7 | 78 | 91 | 8 |
| 0 | 0 | 8 | 387 | 334 | 12 |
| 0 | 1 | 8 | 561 | 565 | 3 |
| -1 | 2 | 8 | 107 | 99 | 2 |
| 0 | 2 | 8 | 325 | 330 | 2 |
| -1 | 3 | 8 | 37 | 21 | 4 |
| 0 | 3 | 8 | 259 | 269 | 3 |
| -2 | 4 | 8 | 809 | 806 | 4 |
| -1 | 4 | 8 | 241 | 235 | 2 |
| 0 | 4 | 8 | 119 | 122 | 3 |
| -2 | 5 | 8 | 469 | 471 | 2 |
| -1 | 5 | 8 | 51 | 51 | 5 |
| 0 | 5 | 8 | 29 | 5 | 12 |
| -3 | 6 | 8 | 316 | 316 | 3 |
| -2 | 6 | 8 | 65 | 55 | 4 |
| -1 | 6 | 8 | 42 | 54 | 4 |
| 0 | 6 | 8 | 142 | 133 | 3 |
| -3 | 7 | 8 | 126 | 130 | 3 |
| -2 | 7 | 8 | 30 | 35 | 8 |
| -1 | 7 | 8 | 241 | 237 | 3 |
| 0 | 7 | 8 | 560 | 566 | 6 |
| -4 | 8 | 8 | 215 | 226 | 9 |
| -3 | 8 | 8 | 154 | 162 | 4 |
| -2 | 8 | 8 | 197 | 198 | 6 |
| -1 | 8 | 8 | 241 | 256 | 9 |
| 0 | 8 | 8 | 254 | 253 | 6 |
| -4 | 9 | 8 | 199 | 207 | 8 |
| -3 | 9 | 8 | 28 | 13 | 17 |
| -2 | 9 | 8 | 35 | 39 | 15 |
| -1 | 9 | 8 | 80 | 101 | 7 |
| 0 | 9 | 8 | 151 | 178 | 15 |
| -5 | 10 | 8 | 278 | 277 | 7 |
| -4 | 10 | 8 | 166 | 192 | 15 |
| -3 | 10 | 8 | 0 | 16 | 1 |
| -2 | 10 | 8 | 160 | 174 | 10 |
| 0 | 1 | 9 | 233 | 242 | 3 |
| 0 | 2 | 9 | 370 | 374 | 4 |
| -1 | 3 | 9 | 284 | 279 | 2 |
| 0 | 3 | 9 | 413 | 408 | 3 |
| -4 | 9 | 10 | 0 | 8 | 1 |
| -3 | 9 | 10 | 331 | 315 | 5 |
| 0 | 1 | 11 | 122 | 123 | 9 |
| 0 | 2 | 11 | 84 | 93 | 6 |
| -1 | 3 | 11 | 73 | 69 | 4 |
| 0 | 3 | 11 | 81 | 91 | 7 |
| -1 | 4 | 11 | 68 | 78 | 5 |
| 0 | 4 | 11 | 190 | 192 | 5 |
| -2 | 5 | 11 | 193 | 194 | 3 |
| -1 | 5 | 11 | 45 | 51 | 7 |
| 0 | 5 | 11 | 82 | 83 | 7 |
| -2 | 6 | 11 | 32 | 18 | 11 |
| -1 | 6 | 11 | 243 | 230 | 3 |
| 0 | 6 | 11 | 55 | 50 | 15 |
| -3 | 7 | 11 | 192 | 206 | 6 |
| -2 | 7 | 11 | 34 | 26 | 18 |
| -1 | 7 | 11 | 110 | 116 | 7 |
| 0 | 7 | 11 | 40 | 37 | 23 |
| -3 | 8 | 11 | 209 | 223 | 8 |
| -2 | 8 | 11 | 124 | 130 | 6 |
| 0 | 0 | 12 | 377 | 317 | 20 |
| 0 | 1 | 12 | 112 | 130 | 20 |
| -1 | 2 | 12 | 92 | 113 | 15 |
| 0 | 2 | 12 | 95 | 113 | 15 |
| -1 | 3 | 12 | 50 | 61 | 9 |
| 0 | 3 | 12 | 226 | 227 | 12 |
| -2 | 4 | 12 | 222 | 221 | 9 |
| -1 | 4 | 12 | 47 | 58 | 9 |
| 0 | 4 | 12 | 56 | 64 | 12 |
| -2 | 5 | 12 | 138 | 164 | 8 |
| -1 | 5 | 12 | 140 | 153 | 8 |
| 0 | 5 | 12 | 165 | 175 | 14 |
| -3 | 6 | 12 | 117 | 130 | 9 |
| -2 | 6 | 12 | 53 | 65 | 9 |
| -1 | 6 | 12 | 100 | 117 | 6 |
| 0 | 6 | 12 | 112 | 132 | 10 |
| -3 | 7 | 12 | 156 | 172 | 7 |
| 0 | 1 | 13 | 24 | 35 | 24 |
| 0 | 2 | 13 | 421 | 389 | 7 |
| -1 | 3 | 13 | 325 | 313 | 7 |
| 0 | 3 | 13 | 252 | 247 | 22 |
| -1 | 4 | 13 | 7 | 23 | 7 |
| 0 | 4 | 13 | 62 | 73 | 17 |
| -2 | 5 | 13 | 116 | 139 | 10 |
| -1 | 5 | 13 | 214 | 229 | 15 |
| 0 | 0 | 14 | 114 | 177 | 102 |

Figure 3:
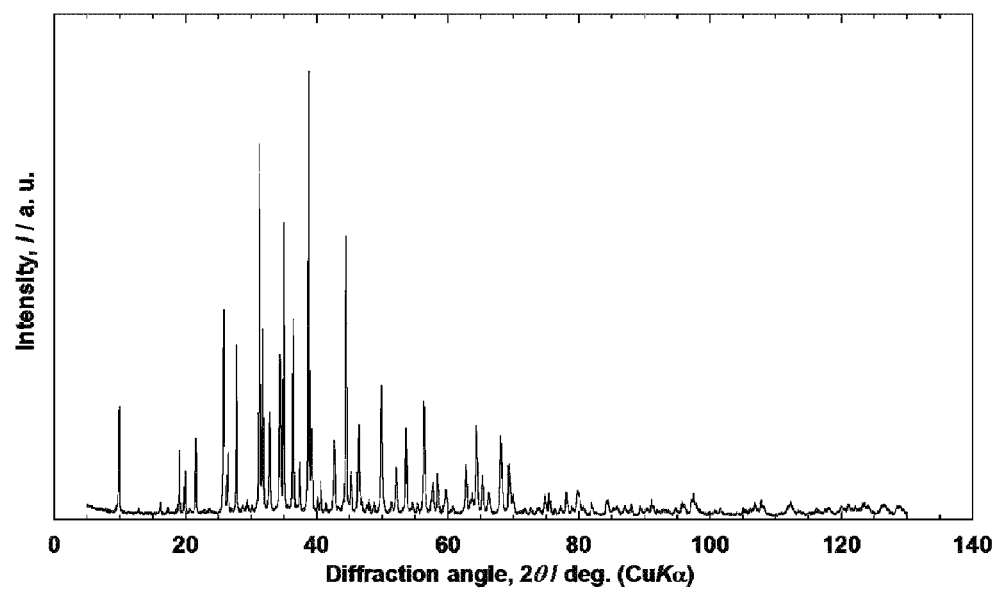
FIG. 3 This is an X-ray diffraction pattern of a crystal sample of the Na—Si—B boride obtained in Example 1.

FIG. 3 shows the X-ray diffraction pattern of the above-mentioned crystal sample. The X-ray diffraction pattern can be explained by the above-mentioned lattice constants.

As a result of the compositional analysis according to a wavelength dispersion X-ray analysis method (WDX), the obtained crystal sample was confirmed to comprise Na, Si and B. In the crystal, no other element than Na, Si and B was detected. These results confirm that the obtained crystal sample is an Na—Si—B boride of the invention having a composition of $Na_6Si_{17.5}B_{74.5}$.

The c-plane of the obtained single crystal was analyzed in a micro-Vickers hardness test and, as a result, the hardness of the crystal was 20.4±0.6 GPa.

Example 2

A crystal sample was obtained under the same condition and according to the same method as in Example 1 except that the crystalline B in Example 1 was changed to amorphous powdery B (by Wako Pure Chemicals, having a purity of 95%).

The crystal sample obtained by heating Na, Si and amorphous B at 1000° C. had a crystal structure of a rhombohedral system, and the lattice constants thereof were a=1.020±0.00 nm and c=1.661±0.008 nm.

Table 5 shows the X-ray diffraction data of the Na—Si—B boride of Example 2.

TABLE 5

X-Ray Diffraction Data of Example 2

| h | k | l | 2θ | d | $I_{obs}$ |
|---|---|---|---|---|---|
| 1 | 0 | 1 | 11.352 | 7.7881 | 2 |
| 0 | 1 | 2 | 14.700 | 6.0211 | 2 |
| 0 | 0 | 3 | 16.159 | 5.4808 | 6 |
| 1 | 1 | 0 | 17.355 | 5.1055 | 1 |
| 0 | 2 | 1 | 20.767 | 4.2698 | 31 |
| 2 | 0 | 2 | 22.818 | 3.8940 | 15 |
| 1 | 1 | -3 | 23.799 | 3.7358 | 2 |
| 1 | 1 | 3 | 23.799 | 3.7358 | 2 |
| 1 | 0 | 4 | 23.852 | 3.7276 | 30 |
| 1 | 2 | -1 | 27.205 | 3.2753 | 0 |
| 2 | 1 | 1 | 27.205 | 3.2753 | 0 |
| 2 | 1 | -2 | 28.611 | 3.0962 | 0 |
| 1 | 2 | 2 | 28.811 | 3.0962 | 0 |
| 0 | 1 | 5 | 28.945 | 3.0623 | 37 |
| 0 | 2 | 4 | 29.650 | 3.0105 | 100 |
| 3 | 0 | 0 | 30.297 | 2.9477 | 5 |
| 0 | 0 | 6 | 32.650 | 2.7404 | 68 |
| 2 | 0 | 5 | 33.946 | 2.6387 | 7 |
| 3 | 0 | 3 | 34.522 | 2.5960 | 26 |
| 0 | 3 | 3 | 34.522 | 2.5960 | 27 |
| 1 | 2 | -4 | 34.559 | 2.5933 | 1 |
| 2 | 1 | 4 | 34.559 | 2.5933 | 1 |
| 2 | 2 | 0 | 35.126 | 2.5527 | 24 |
| 3 | 1 | -1 | 37.090 | 2.4258 | 1 |
| 1 | 3 | 1 | 37.030 | 2.4258 | 1 |
| 1 | 1 | -6 | 37.207 | 2.4146 | 0 |
| 1 | 1 | 6 | 37.208 | 2.4146 | 0 |
| 1 | 3 | -2 | 38.265 | 2.3502 | 0 |
| 3 | 1 | 2 | 38.265 | 2.3502 | 0 |
| 1 | 2 | 5 | 38.369 | 2.3441 | 1 |
| 2 | 1 | -5 | 38.369 | 2.3441 | 1 |
| 2 | 2 | -3 | 38.887 | 2.3141 | 0 |
| 2 | 2 | 3 | 38.887 | 2.3141 | 76 |
| 1 | 0 | 7 | 39.670 | 2.2702 | 2 |
| 4 | 0 | 1 | 41.167 | 2.1910 | 2 |
| 0 | 4 | 2 | 42.300 | 2.1349 | 16 |
| 1 | 3 | 4 | 42.905 | 2.1062 | 1 |
| 3 | 1 | -4 | 42.905 | 2.1062 | 1 |
| 0 | 2 | 7 | 43.597 | 2.0744 | 38 |
| 3 | 2 | 1 | 44.967 | 2.0135 | 5 |
| 2 | 3 | -1 | 44.987 | 2.0135 | 5 |
| 3 | 0 | 6 | 45.138 | 2.0070 | 5 |
| 0 | 3 | 6 | 45.138 | 2.0070 | 0 |
| 0 | 1 | 8 | 45.260 | 2.0019 | 26 |
| 2 | 3 | 2 | 46.044 | 1.9696 | 1 |
| 3 | 2 | -2 | 46.044 | 1.9696 | 1 |
| 1 | 3 | -5 | 46.134 | 1.9660 | 1 |
| 3 | 1 | 5 | 46.134 | 1.9660 | 1 |
| 4 | 0 | 4 | 46.610 | 1.9470 | 2 |
| 4 | 1 | 0 | 47.054 | 1.9297 | 1 |
| 1 | 4 | 0 | 47.054 | 1.9297 | 1 |
| 1 | 2 | -7 | 47.259 | 1.9216 | 1 |
| 2 | 1 | 7 | 47.259 | 1.9218 | 1 |
| 2 | 2 | -6 | 48.710 | 1.8679 | 0 |
| 2 | 2 | 6 | 48.710 | 1.8679 | 0 |
| 2 | 0 | 8 | 48.824 | 1.8638 | 4 |
| 0 | 4 | 5 | 49.650 | 1.8347 | 0 |
| 0 | 0 | 9 | 49.875 | 1.8269 | 0 |
| 1 | 4 | -3 | 50.074 | 1.8202 | 0 |
| 4 | 1 | -3 | 50.074 | 1.8202 | 2 |
| 4 | 1 | 3 | 50.074 | 1.8202 | 0 |
| 1 | 4 | 3 | 50.074 | 1.8202 | 2 |
| 2 | 3 | -4 | 50.102 | 1.8192 | 5 |
| 3 | 2 | 4 | 50.102 | 1.8192 | 2 |
| 0 | 5 | 1 | 51.960 | 1.7565 | 1 |
| 1 | 2 | 8 | 52.206 | 1.7508 | 8 |
| 2 | 1 | -8 | 52.205 | 1.7506 | 8 |
| 5 | 0 | 2 | 52.912 | 1.7290 | 3 |
| 3 | 2 | -5 | 52.992 | 1.7266 | 2 |
| 2 | 3 | 5 | 52.992 | 1.7266 | 2 |
| 1 | 1 | -9 | 53.207 | 1.7201 | 0 |
| 1 | 1 | 9 | 53.207 | 1.7201 | 0 |
| 3 | 3 | 0 | 53.825 | 1.7018 | 6 |
| 3 | 1 | -7 | 54.011 | 1.6964 | 0 |
| 1 | 3 | 7 | 54.011 | 1.6964 | 0 |
| 4 | 2 | -1 | 55.202 | 1.6626 | 1 |
| 2 | 4 | 1 | 55.202 | 1.6628 | 1 |
| 4 | 2 | 2 | 56.116 | 1.6377 | 3 |
| 2 | 4 | -2 | 56.116 | 1.6377 | 3 |
| 3 | 3 | -3 | 56.582 | 1.6253 | 0 |
| 3 | 3 | 3 | 56.582 | 1.6253 | 0 |
| 0 | 5 | 4 | 56.607 | 1.6246 | 0 |
| 1 | 0 | 10 | 56.916 | 1.6165 | 0 |
| 4 | 0 | 7 | 57.173 | 1.6099 | 2 |
| 1 | 5 | -1 | 58.321 | 1.5809 | 0 |
| 5 | 1 | 1 | 58.321 | 1.5809 | 0 |
| 4 | 1 | -6 | 58.447 | 1.5778 | 2 |
| 1 | 4 | -6 | 58.447 | 1.5778 | 0 |
| 1 | 4 | 6 | 58.447 | 1.5778 | 2 |
| 4 | 1 | 6 | 58.447 | 1.5778 | 0 |
| 1 | 3 | -6 | 58.548 | 1.5753 | 0 |
| 3 | 1 | 8 | 58.548 | 1.5753 | 0 |
| 1 | 5 | 2 | 59.203 | 1.5594 | 1 |
| 5 | 1 | -2 | 59.203 | 1.5594 | 1 |
| 5 | 0 | 5 | 59.278 | 1.5576 | 1 |
| 0 | 3 | 9 | 59.478 | 1.5529 | 16 |
| 3 | 0 | 9 | 59.478 | 1.5529 | 6 |
| 4 | 2 | -4 | 59.679 | 1.5481 | 2 |
| 2 | 4 | 4 | 59.679 | 1.5481 | 2 |
| 0 | 2 | 10 | 59.977 | 1.5411 | 5 |
| 3 | 2 | 7 | 60.226 | 1.6353 | 4 |
| 2 | 3 | -7 | 60.225 | 1.5353 | 4 |
| 0 | 4 | 8 | 61.559 | 1.5053 | 3 |
| 2 | 4 | -5 | 62.268 | 1.4898 | 2 |
| 4 | 2 | 5 | 62.268 | 1.4898 | 2 |
| 2 | 2 | 9 | 62.462 | 1.4857 | 7 |
| 2 | 2 | -9 | 62.462 | 1.4857 | 7 |
| 5 | 1 | 4 | 62.657 | 1.4815 | 1 |
| 1 | 5 | -4 | 62.657 | 1.4815 | 1 |
| 2 | 1 | 10 | 62.947 | 1.4754 | 0 |
| 1 | 2 | -10 | 62.947 | 1.4754 | 0 |
| 0 | 1 | 11 | 63.019 | 1.4739 | 7 |
| 6 | 0 | 0 | 63.020 | 1.4738 | 1 |
| 3 | 4 | -1 | 64.272 | 1.4461 | 0 |
| 4 | 3 | 1 | 64.272 | 1.4481 | 0 |
| 3 | 3 | -6 | 64.391 | 1.4457 | 4 |
| 3 | 3 | 6 | 64.391 | 1.4457 | 4 |
| 3 | 2 | -8 | 64.486 | 1.4438 | 0 |
| 2 | 3 | 8 | 64.486 | 1.4438 | 0 |
| 3 | 4 | 2 | 65.106 | 1.4316 | 0 |
| 4 | 3 | -2 | 65.106 | 1.4316 | 0 |
| 5 | 1 | -5 | 65.177 | 1.4302 | 0 |
| 1 | 5 | 5 | 65.177 | 1.4302 | 0 |
| 6 | 0 | 3 | 65.533 | 1.4233 | 1 |
| 0 | 6 | 3 | 65.533 | 1.4233 | 1 |
| 2 | 0 | 11 | 65.910 | 1.4160 | 0 |
| 2 | 5 | 0 | 65.912 | 1.4160 | 0 |
| 5 | 2 | 0 | 65.912 | 1.4160 | 19 |
| 0 | 5 | 7 | 66.076 | 1.4129 | 5 |
| 5 | 2 | -3 | 68.368 | 1.3710 | 0 |
| 2 | 5 | -3 | 68.368 | 1.3710 | 0 |
| 5 | 2 | 3 | 68.368 | 1.3710 | 1 |
| 2 | 5 | 3 | 68.368 | 1.3710 | 0 |
| 4 | 3 | 4 | 68.391 | 1.3706 | 0 |
| 3 | 4 | -4 | 68.391 | 1.3706 | 0 |
| 0 | 0 | 12 | 68.413 | 1.3702 | 2 |
| 3 | 1 | -10 | 68.668 | 1.3657 | 2 |
| 1 | 3 | 10 | 68.668 | 1.3657 | 6 |
| 1 | 2 | 11 | 68.738 | 1.3645 | 0 |
| 2 | 1 | -11 | 68.738 | 1.3645 | 0 |
| 4 | 2 | -7 | 68.900 | 1.3617 | 4 |
| 2 | 4 | 7 | 68.900 | 1.3617 | 4 |
| 1 | 6 | 1 | 69.937 | 1.3440 | 0 |
| 6 | 1 | -1 | 69.937 | 1.3440 | 0 |
| 5 | 0 | 8 | 70.143 | 1.3406 | 7 |

Figure 4:
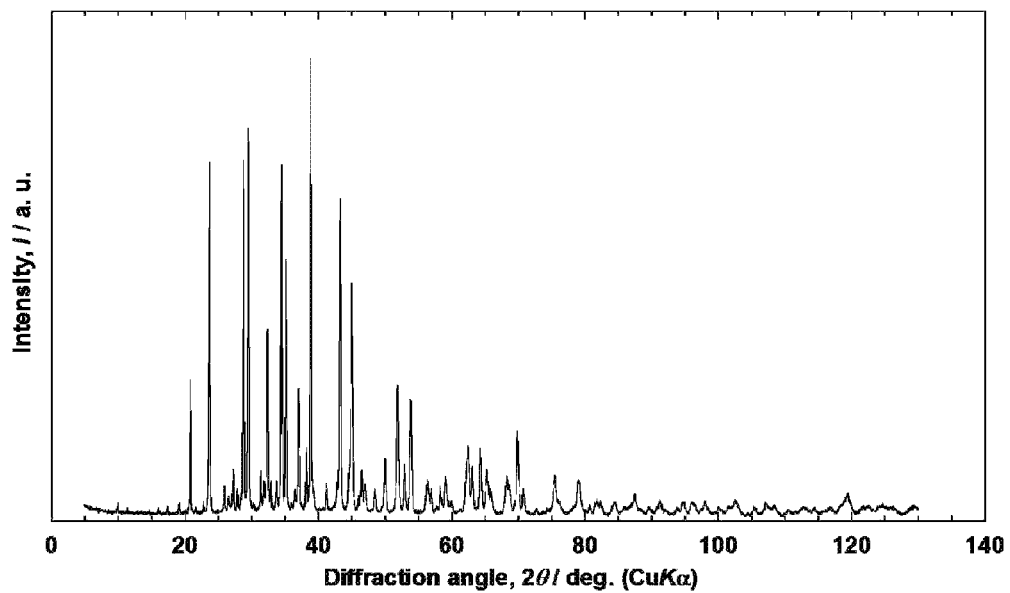
FIG. 4 This is an X-ray diffraction pattern of a crystal sample of the Na—Si—B boride obtained in Example 2.

FIG. 4 shows the X-ray diffraction pattern of the above-mentioned crystal sample. The X-ray diffraction pattern can be explained by the above-mentioned lattice constants, As a result of the compositional analysis according to a wavelength dispersion X-ray analysis method (WDX), the crystal sample obtained here was confirmed to comprise Na, Si and B like in Example 1. In the crystal, no other element than Na, Si and B was detected. These results confirm that the obtained crystal sample is an Na—Si—B boride of the invention.

Next, the Na—Si—B boride reaction-sintered product of the invention is described concretely. The high-purity argon gas, the BN crucible and the reactor used in the following Examples 3 and 4 are the same as those used in Examples 1 and 2.

Example 3

0.1 g of amorphous powdery B (by Wake Pure Chemicals, having a purity of 95%) was diced, powdered and compressed to give a B compact (1.9 mm×3.0 mm×14.0 mm). In a glove box having therein a high-purity argon gas atmosphere, Na (by Nippon Soda, having a purity of 99.95%) and powdery Si (by Kojundo Chemical Laboratory, having a purity of 99.999%) were so weighed that the ratio by mol of Na/Si/B could be 3/1/1.

As shown in FIG. 1(b), Na1 and Si2 were put into a BN crucible 6 along with the formed B compact 4 put therein. Next, the BN crucible 6 was set inside a reactor 7, and the reactor 7 was sealed up with a cap 8 in a high-purity argon atmosphere. Subsequently, the reactor 7 was set in an electric furnace, and heated up to 800 to 1000° C. taking 2 hours, then left as such for 24 hours, and thereafter cooled to room temperature, and the reactor 7 was taken out.

The reactor 7 was cut in the globe box, and the BN crucible 6 was taken out. Na and NaSi surrounded the compact. This was washed with ethanol and distilled water to remove Na and NaSi, and a polycrystalline sample was thus collected.

Figure 5:
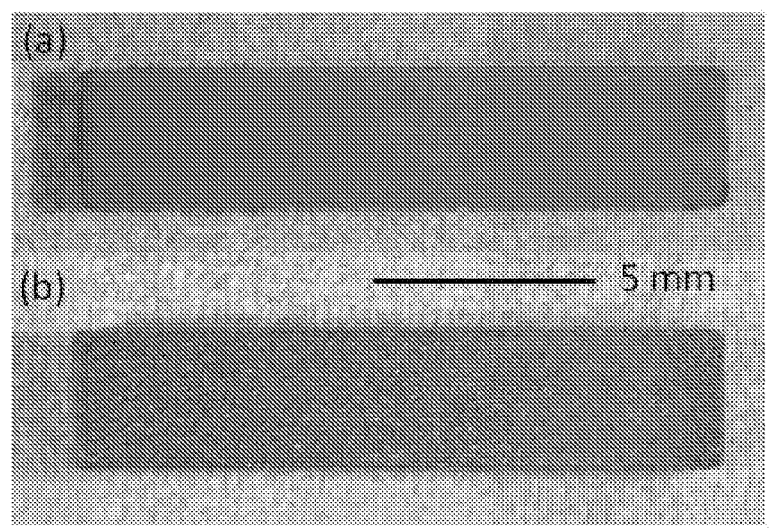
FIG. 5 This shows pictures of the outward appearance of the B compact (a) in Example 3 and a sample of the polycrystalline reaction-sintered product (b) obtained therein.

FIG. 5 shows optical micrographs of the B compact (a) used as the starting material and the obtained polycrystalline sample (b). The dimension of the polycrystalline product (b) was 1.99 mm×3.1 mm×14.40 mm, and the volume thereof expanded by about 11% as compared with that of the B compact (a) before heating.

Figure 6:
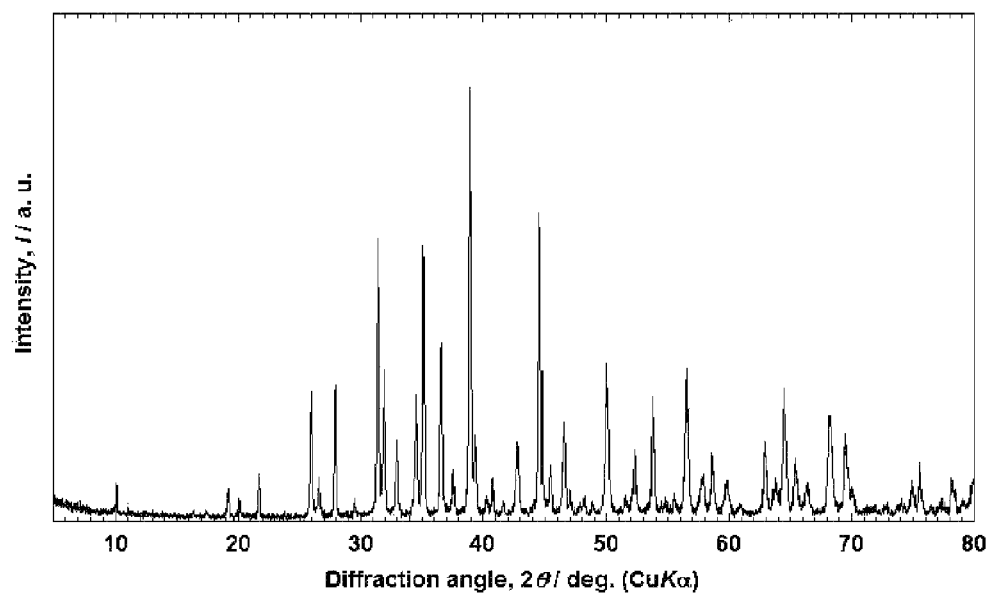
FIG. 6 This is an X-ray diffraction pattern of a sample of the polycrystalline reaction-sintered product obtained in Example 3.

The polycrystalline sample was analyzed through X-ray diffractiometry using an X-ray diffractometry apparatus (Rigaku's "RINT" (trade name) with a radiation source of CuKα). The X-ray diffraction pattern of the polycrystalline sample is shown in FIG. 6. The X-ray diffraction pattern confirms that the obtained polycrystalline sample is $Na_8Si_{17.5}B_{74.5}$ ($P6_3/mmc$ with lattice constants of a=1.024±0.008 nm and c=1.092±0.008 nm), and is an Na—Si—B boride polycrystalline product of the invention.

The density of the polycrystalline reaction product sample was 1.88 $Mg/m^3$, and was about 76% of the theoretical density of $Na_8Si_{17.5}B_{74.5}$, 2.47 $Mg/m^3$.

The obtained polycrystalline reaction-sintered product sample was tested according to a room temperature bending test, and the bending strength of the sample was 104 MPa,

Example 4

Amorphous powdery B (by Wako Pure Chemicals, having a purity of 95%) and powdery Si (by Kojundo Chemical Laboratory, having a purity of 99.999%) were weighed in a ratio by mel of 4/x (where X is 1, 2 or 3), thereby preparing three different types of mixtures, and the mixtures were separately ground, using an agate mortar for each. About 0.16 g of each mixed powder was diced, further powdered and compressed, thereby giving three different types of B/Si mixed compacts (2.4 b 2.5 mm×3.0 mm×14.0 mm). In a glove box having therein a high-purity argon gas atmosphere, about 0.5 g of Na (by Nippon Soda, having a purity of 99.95%) and the compact prepared above were put in different BN crucibles 6.

Next, as in FIG. 1(c), the BN crucible 6 containing the B/Si mixed compact 5 therein and the BN crucible 6 containing Na1 therein were separately set in a reactor 7, and the reactor 7 was sealed up with a cap 8 in a high-purity argon atmosphere. Subsequently, the reactor 7 was set in an electric furnace, and heated up to 900° C. taking 2 hours, then left as such for 24 hours, and thereafter cooled to room temperature, and the reactor 7 was taken out.

Figure 7:
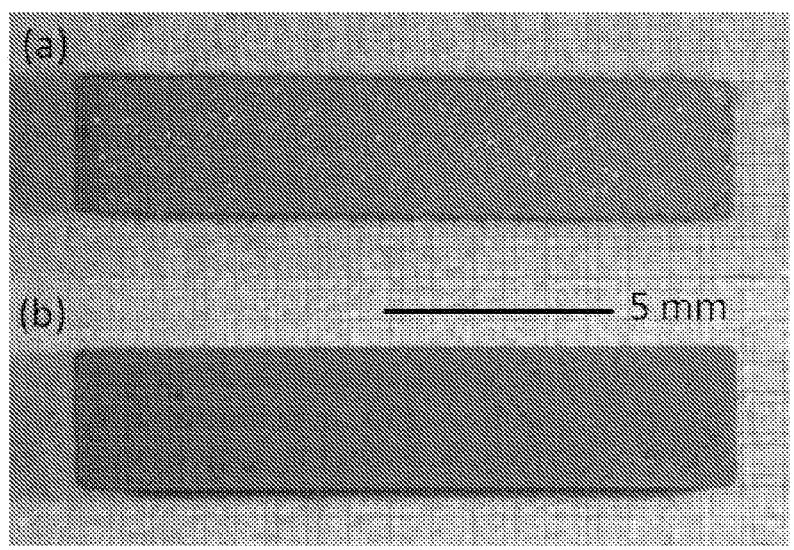
FIG. 7 This shows pictures of the outward appearance of the B/Si mixed compact (a) in Example 4 and a sample of the polycrystalline reaction-sintered product (b) obtained therein.

The reactor 7 was cut in the globe box, and the BN crucible 6 was taken out. Na and NaSi surrounded the compact 5. This was washed with ethanol and distilled water to remove Na and NaSi, and a reaction-sintered product sample was collected. The above three different types of starting mixtures with the Si ratio x of 1, 2 or 3 gave the respective polycrystalline samples, FIG. 7 shows optical micrographs of the Na/Si mixed compact (a) under the condition of Si ratio x=1 and the polycrystalline sample (b) obtained under that condition. The dimension of the Na/Si mixed compact before heating was 2.5 mm×3.0 mm×14.0 mm, while the dimension of the obtained polycrystalline sample was 2.7 mm×3.1 mm×14.3 mm. All the polycrystalline samples produced under the condition of Si ratio, x=1, 2 or 3 maintained the Na/Si mixed compact before heating.

The polycrystalline samples were analyzed through X-ray diffractiometry using an X-ray diffractometry apparatus (Rigaku's "RINT" (trade name) with a radiation source of CuKα). The X-ray diffraction patterns confirm that all the polycrystalline reaction-sintered product samples are $Na_8Si_{17.5}B_{74.5}$ ($P6_3/mmc$ with lattice constants of a=1.024±0.008 nm and c=1.092±0.008 nm), and are Na—Si—B boride polycrystalline products of the invention.

The density of the polycrystalline samples obtained under the condition of Si ratio x=1, 2 or 3 was 1.45, 1.24 or 0.92 $Mg/m^3$, respectively, and was about 59, 50 or 37%, respectively, of the theoretical density of $Na_8Si_{17.5}B_{74.5}$, 2.47 $Mg/m^3$.

Example 5

Amorphous powdery B (by Wako Pure Chemicals, having a purity of 65%) and, as C, carbon black powder (by Mitsubishi Chemical) were weighed in a ratio by mol of 5/1, and mixed using an agate mortar. 0.12 g of the mixed powder was diced, further powdered and compressed to give a B/C mixed compact 9 (2.0 mm×3.0 mm×14.0 mm).

Next, as shown in FIG. 1(d), the compact 9 was put into a BN crucible 6 along with about 0.2 g of metal sodium 1 (by Nippon Soda, having a purity of 99.95%) as Na, in a glove box having therein a high-purity argon gas atmosphere (in which the concentration of $O_2$ and $H_2O$ was less than 1 ppm each). The BN crucible 6 used here is a sintering BN crucible (by Showa Denko).

Next, the BN crucible 6 was set inside a reactor 7 (made of stainless SUS316), and the reactor 7 was sealed up with a cap 8 made of stainless in a high-purity argon atmosphere. The reactor 7 used here has an inner diameter of 10 mm and a length of from 80 to 100 mm. Subsequently, the reactor 7 was set in an electric furnace, and heated up to 800 to 1000° C. taking 2 hours, then left as such for 24 hours, and thereafter cooled to room temperature, and the reactor 7 was taken out.

The reactor 7 was cut in the globe box, and the BN crucible 6 was taken out. The surface of the sample in the BN crucible was covered with Na.

The sample obtained in the above was washed with ethanol and distilled water to remove Na, thereby giving a polycrystalline product sample.

FIG. 8 shows optical micrographs of the B/C mixed compact (a) and the obtained polycrystalline sample (b). The dimension of the polycrystalline reaction product sample was 2.16 mm×3.12 mm×14.58 mm, and the volume thereof expanded by about 17% as compared with that of the B/C mixed compact before heating.

The polycrystalline reaction product sample was analyzed through X-ray diffractometry using an X-ray diffractometry apparatus (Rigaku's "RINT" (trade name) with a radiation source of CuKα). The X-ray diffraction pattern of the sample is shown in FIG. 9. The X-ray diffraction pattern confirms that the obtained polycrystalline product sample is $NaCB_6$ (Pm-3m with a lattice constant a=0.409±0.008 nm), and is a boride polycrystalline product of the invention.

The density of the polycrystalline product sample was 1.61 $Mg/m^3$, and was about 75% of the theoretical density of $NaCB_5$, 2.16 $Mg/m^3$.

The obtained polycrystalline product sample was tested according to a room temperature bending test, and the bending strength of the sample was 92 MPa.

DESCRIPTION OF REFERENCE NUMERALS

1 Metal Sodium
2 Silicon
3 Boron
4 Boride Compact
5 Boron/Silicon Compact
6 BN Crucible
7 Reactor
8 Cap
9 Boron/Carbon Compact

The invention claimed is:

1. A ternary boride represented by formula $Na_xSi_yB_z$, wherein 0<x, x<y<4x, and 8x<z<20x.

2. A ternary boride having a composition Na—Si—B, wherein a crystal structure of the boride is a hexagonal system or a rhombohedral system.

* * * * *